(12) United States Patent
Sugizaki

(10) Patent No.: US 8,957,450 B2
(45) Date of Patent: Feb. 17, 2015

(54) SEMICONDUCTOR LIGHT EMITTING DEVICE AND METHOD FOR MANUFACTURING SAME

(71) Applicant: Kabushiki Kaisha Toshiba, Minato-ku, Tokyo (JP)

(72) Inventor: Yoshiaki Sugizaki, Kanagawa-ken (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 13/925,606

(22) Filed: Jun. 24, 2013

(65) Prior Publication Data

US 2013/0285101 A1    Oct. 31, 2013

Related U.S. Application Data

(62) Division of application No. 12/880,673, filed on Sep. 13, 2010, now Pat. No. 8,502,260.

(30) Foreign Application Priority Data

May 24, 2010    (JP) .................................. 2010-118698

(51) Int. Cl.
*H01L 33/62* (2010.01)
*H01L 33/38* (2010.01)
(Continued)

(52) U.S. Cl.
CPC ............ *H01L 33/62* (2013.01); *H01L 33/0079* (2013.01); *H01L 33/38* (2013.01); *H01L 33/486* (2013.01); *H01L 2924/0002* (2013.01)
USPC ...... 257/99; 257/737; 257/739; 257/E33.066; 257/E33.021

(58) Field of Classification Search
CPC ......... H01L 33/38; H01L 33/62; H01L 24/13; H01L 24/16
USPC ............. 257/99, 737, 739, E33.066, E23.021
See application file for complete search history.

(56) References Cited

U.S. PATENT DOCUMENTS 6,331,450 B1    12/2001  Uemura
2002/0017727 A1    2/2002  Uemura
(Continued)

FOREIGN PATENT DOCUMENTS

JP         2005079551 A        3/2005

OTHER PUBLICATIONS

Taiwanese Office Action issued in counterpart Taiwanese patent application No. 099129693 on Aug. 13, 2013, along with English translation thereof.

(Continued)

*Primary Examiner* — Yu Chen
(74) *Attorney, Agent, or Firm* — White & Case LLP

(57)    ABSTRACT

According to one embodiment, a semiconductor light emitting device includes a semiconductor layer, a first electrode, a second electrode, an insulating layer, a first interconnect layer, a second interconnect layer, a first metal pillar, a second metal pillar, a film covering a side face of the first metal pillar and a side face of the second metal pillar, and a resin layer. The semiconductor layer includes a light emitting layer, a first major surface, and a second major surface formed on a side opposite to the first major surface. The film has a solder wettability poorer than a solder wettability of the first metal pillar and a solder wettability of the second metal pillar. The resin layer covers at least part of the film.

10 Claims, 26 Drawing Sheets

(51) Int. Cl.
*H01L 33/00* (2010.01)
*H01L 33/48* (2010.01)

(56) References Cited

U.S. PATENT DOCUMENTS

| | | |
|---|---|---|
| 2005/0194605 A1 | 9/2005 | Shelton et al. |
| 2006/0273335 A1 | 12/2006 | Asahara et al. |
| 2007/0012938 A1 | 1/2007 | Yu et al. |
| 2007/0262338 A1 | 11/2007 | Higashi et al. |
| 2007/0284755 A1 | 12/2007 | Nomoto et al. |
| 2008/0026318 A1* | 1/2008 | Schultz et al. ............ 430/270.1 |
| 2010/0148198 A1 | 6/2010 | Sugizaki et al. |

OTHER PUBLICATIONS

Japanese Office Action for JP Application No. 2010-118698 mailed Apr. 11, 2013, and an English translation thereof.
Extended European Search Report for EP Application No. 10176158.3 mailed Jul. 7, 2011.

* cited by examiner

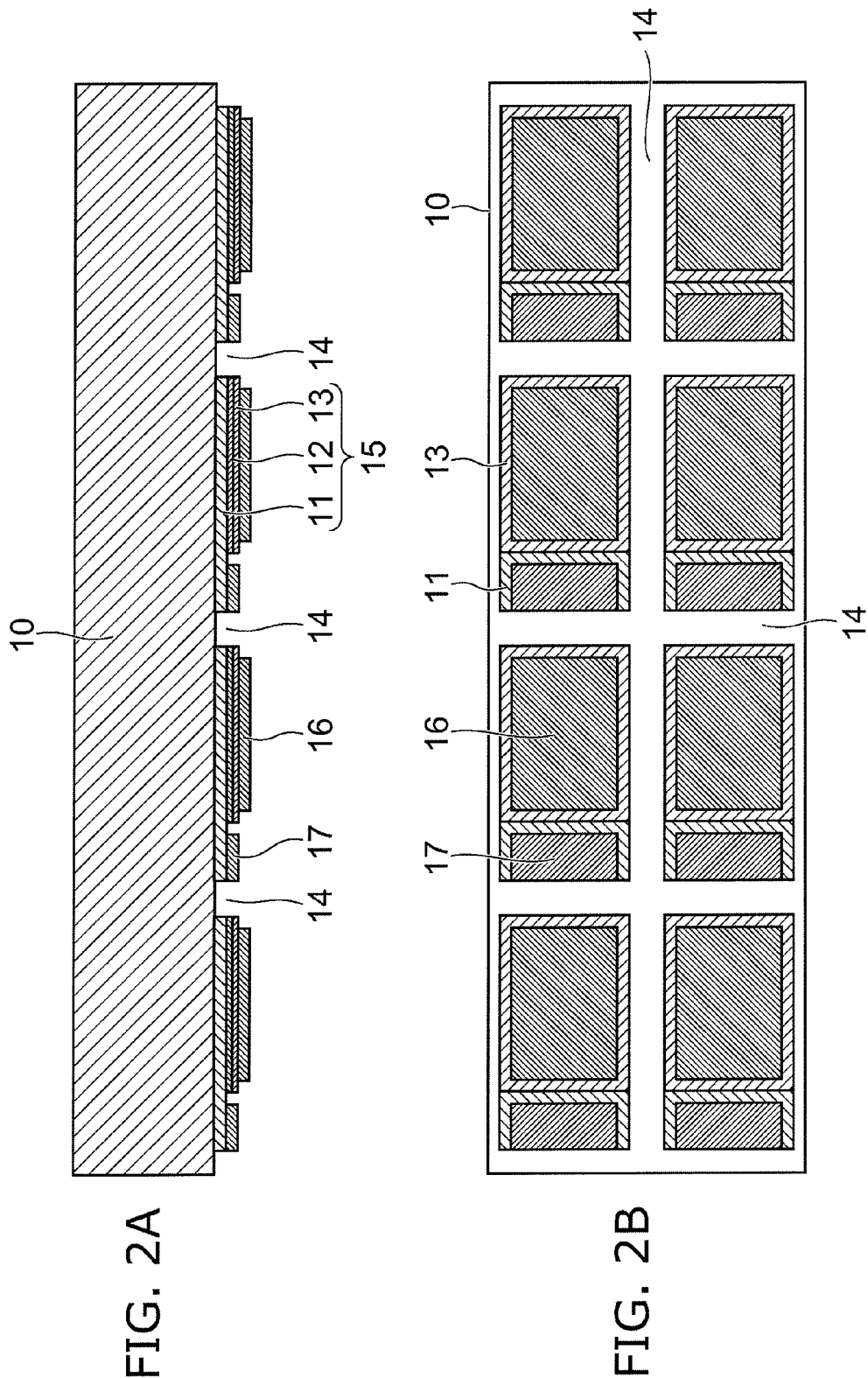

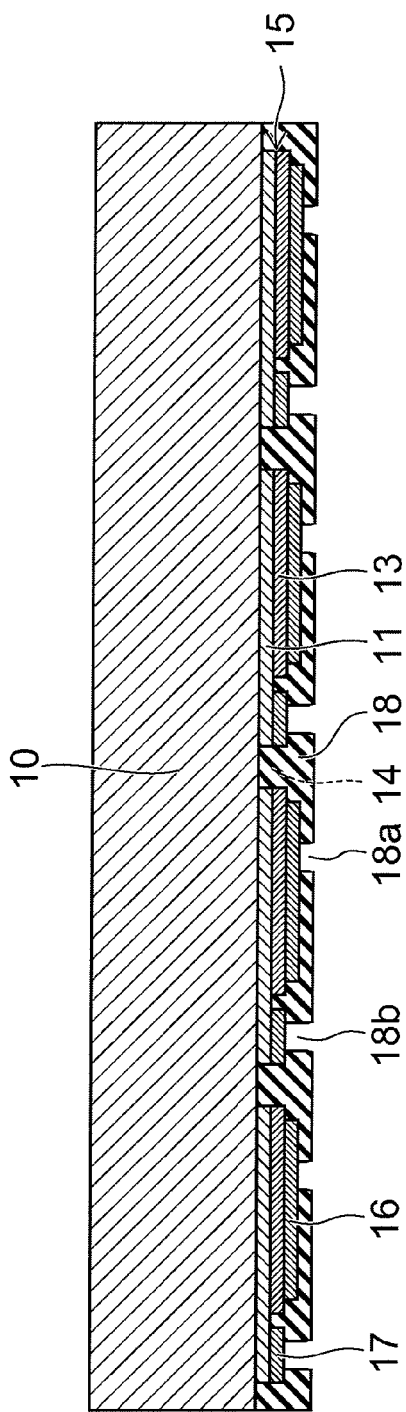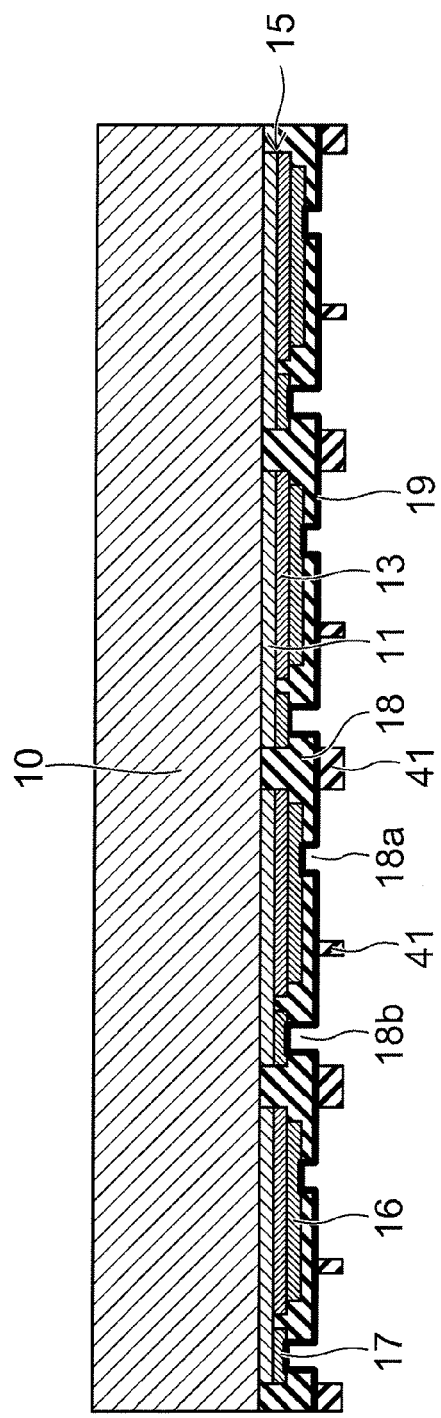
FIG. 3A
FIG. 3B

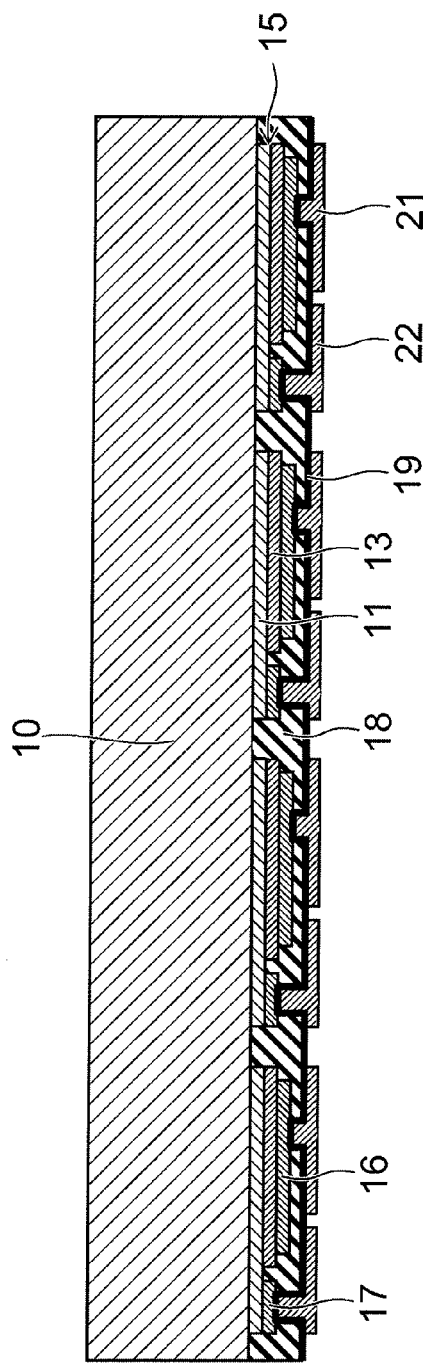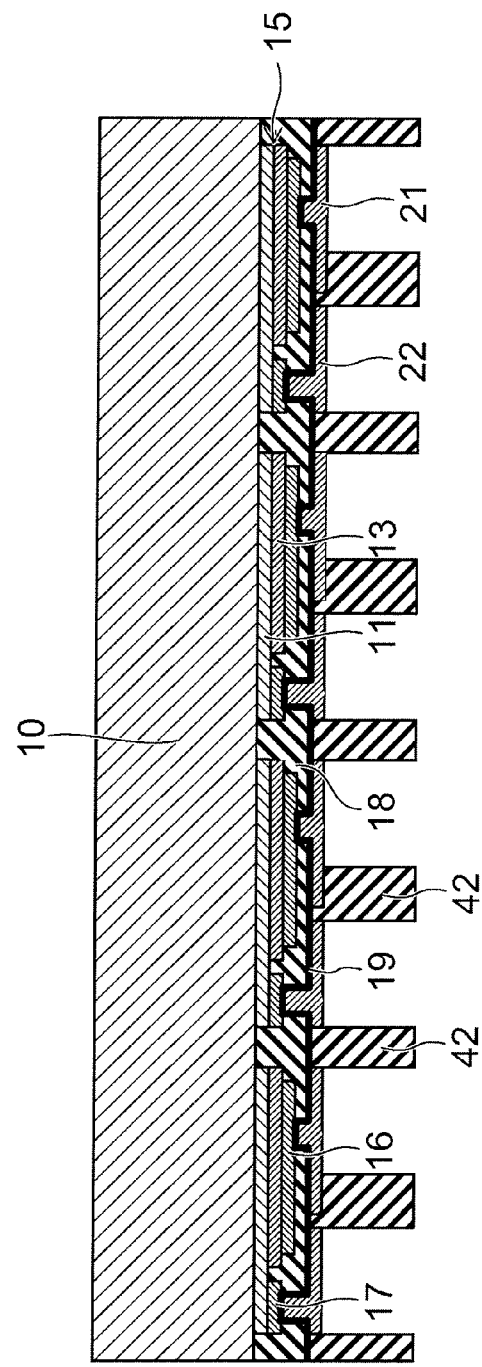
FIG. 5A

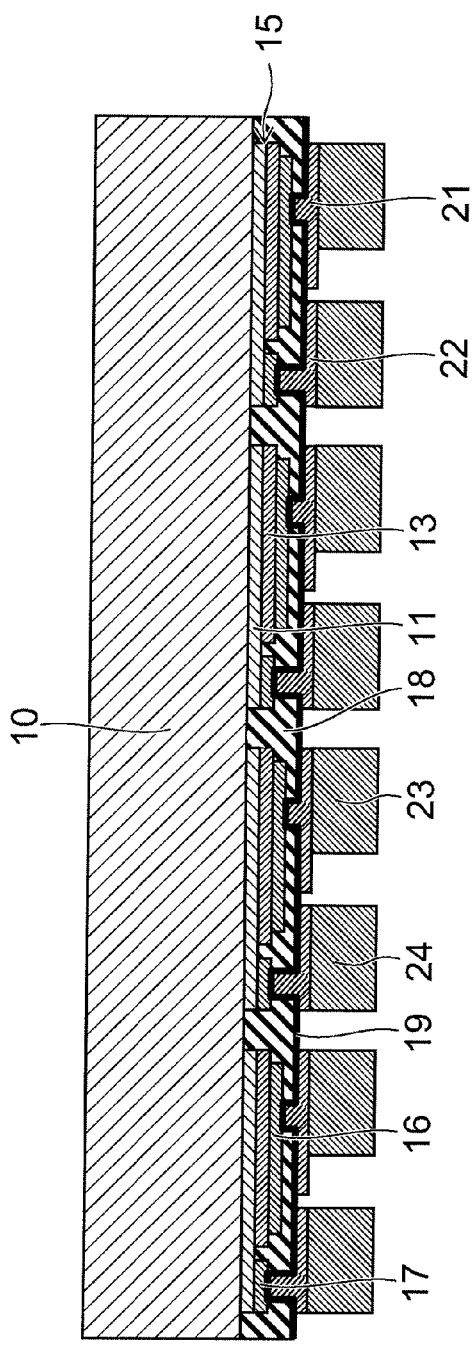
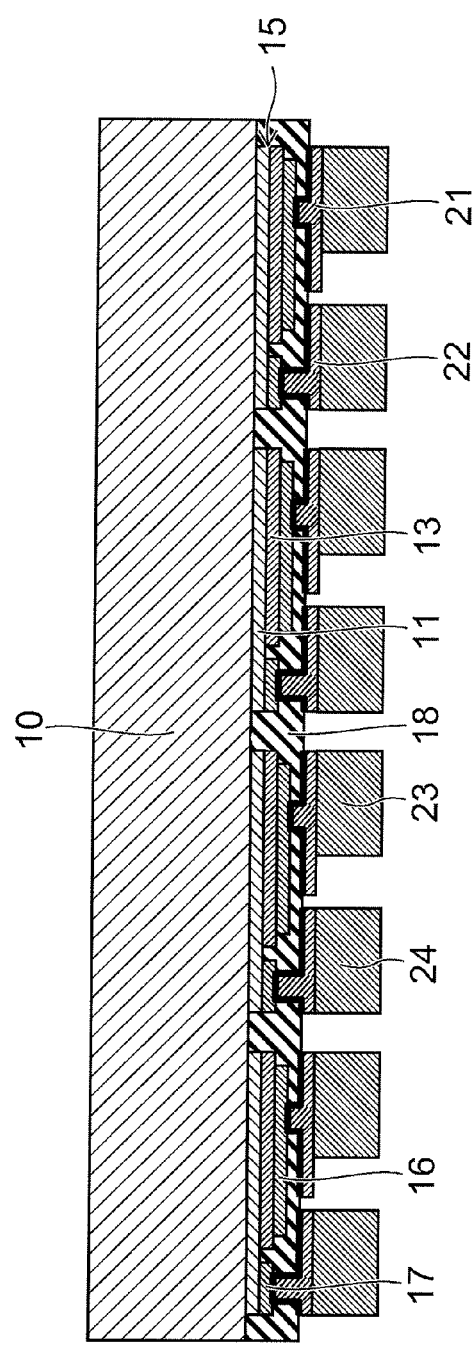
FIG. 7A
FIG. 7B

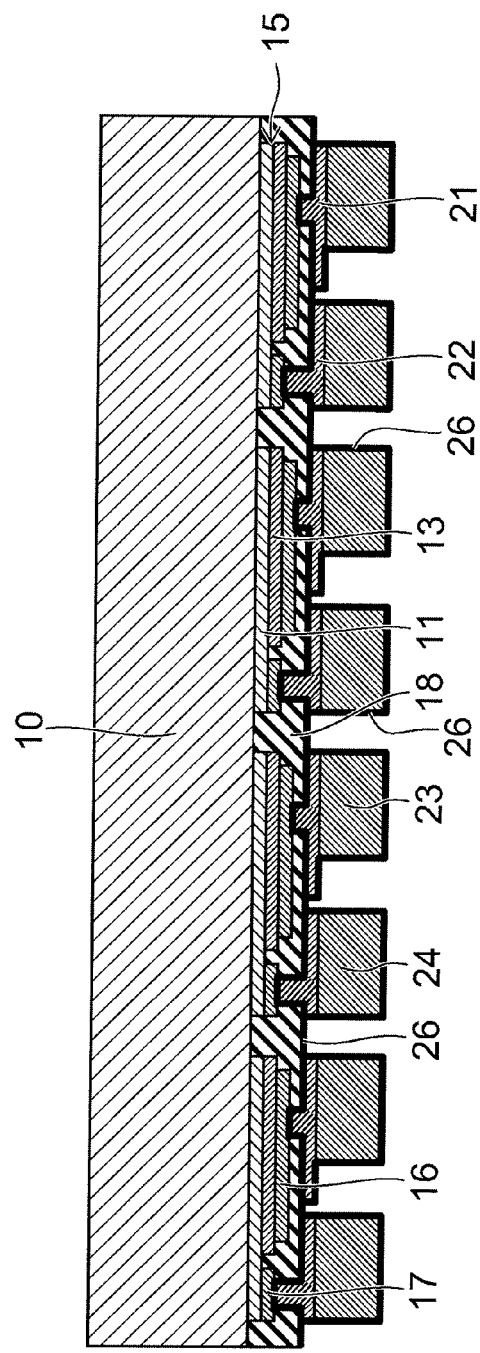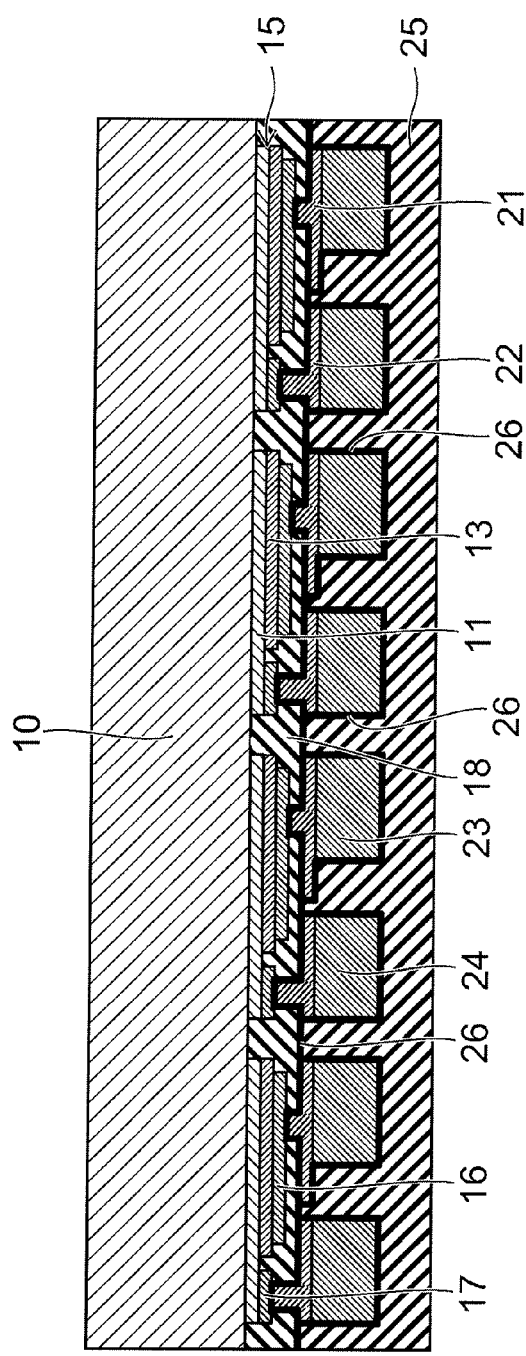
FIG. 8A
FIG. 8B

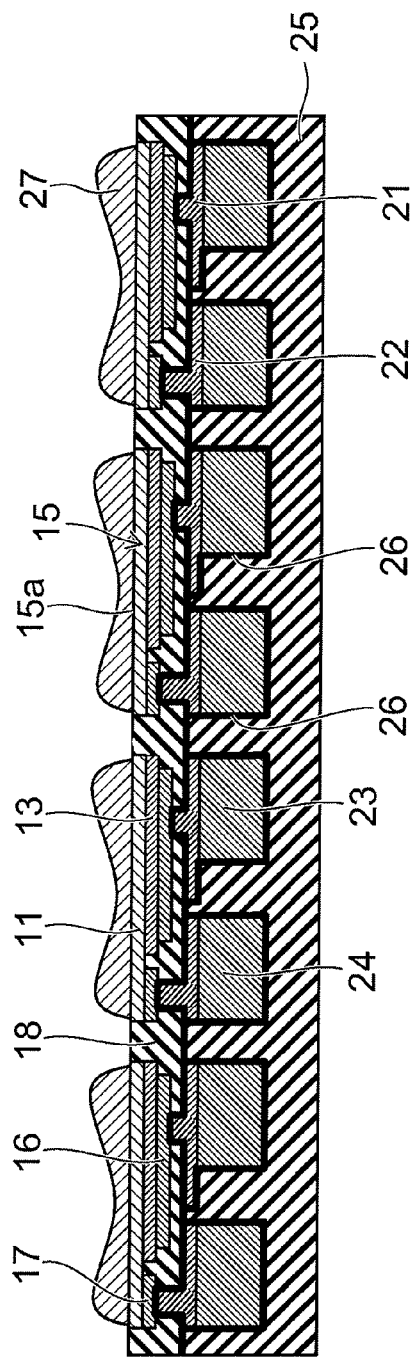
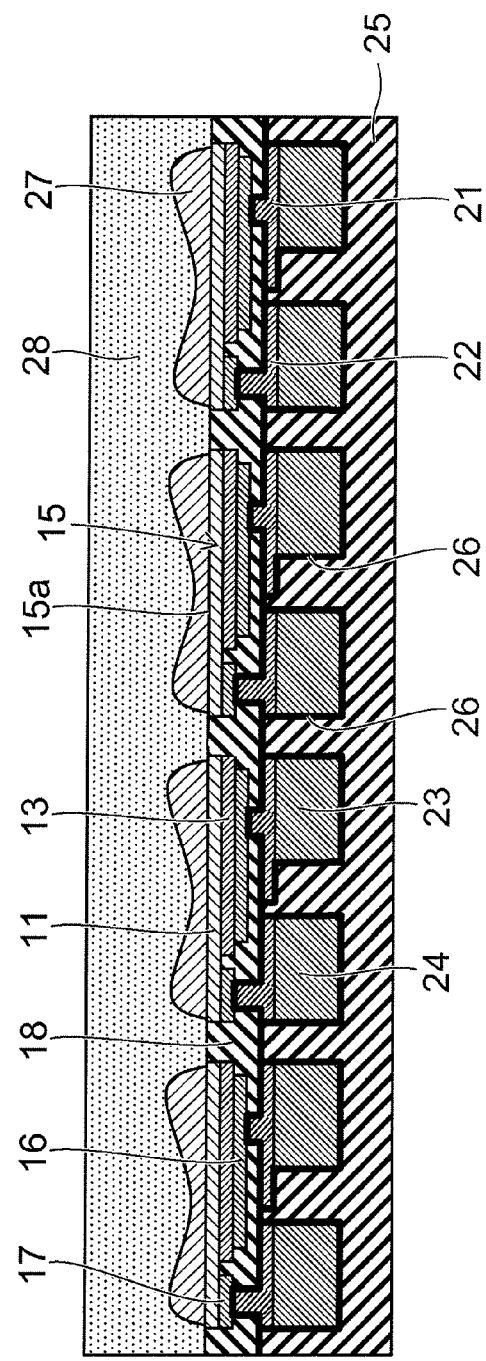
FIG. 10A
FIG. 10B

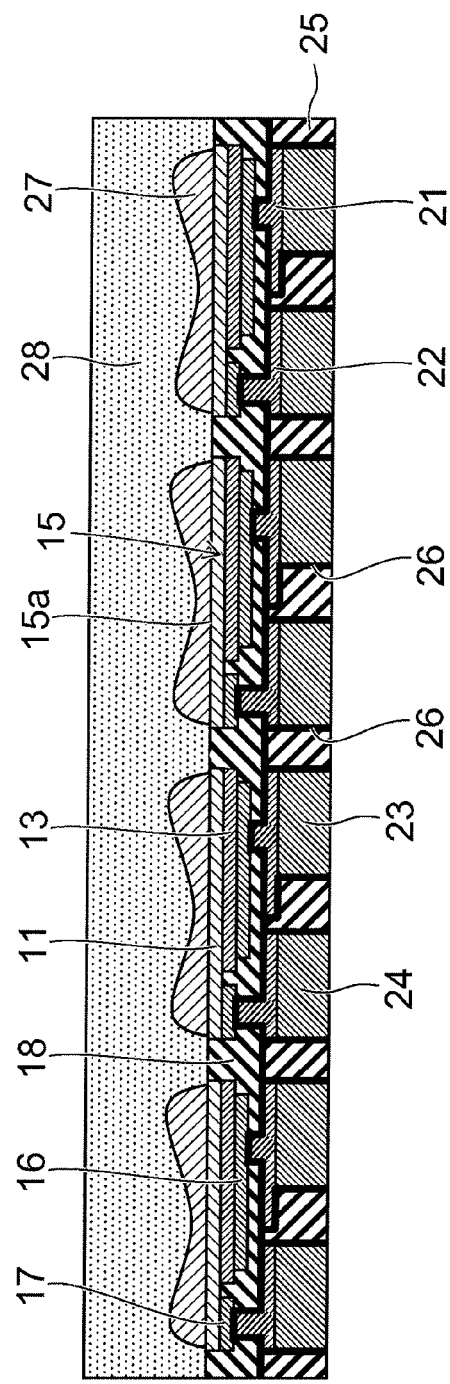
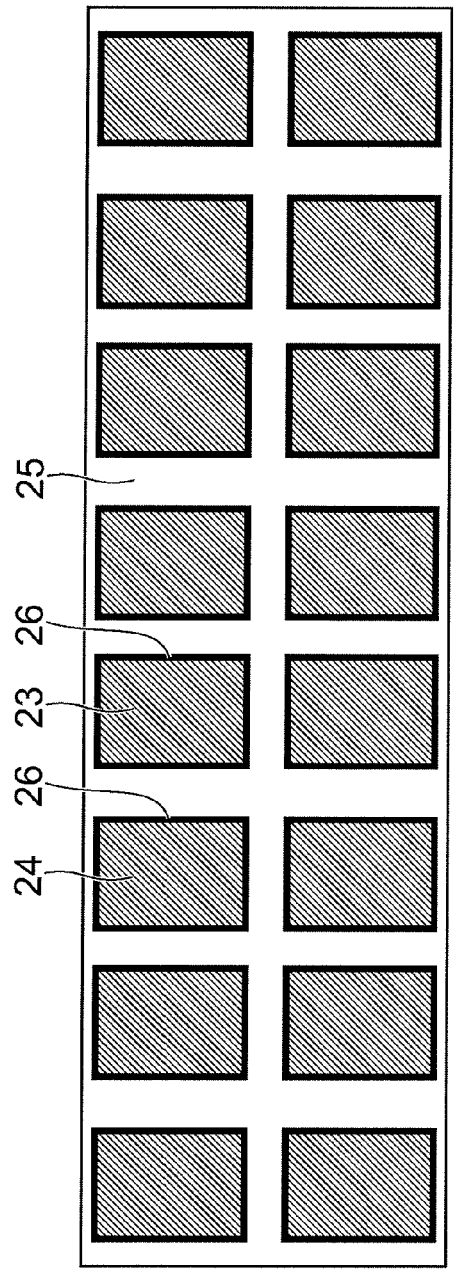
FIG. 11A
FIG. 11B

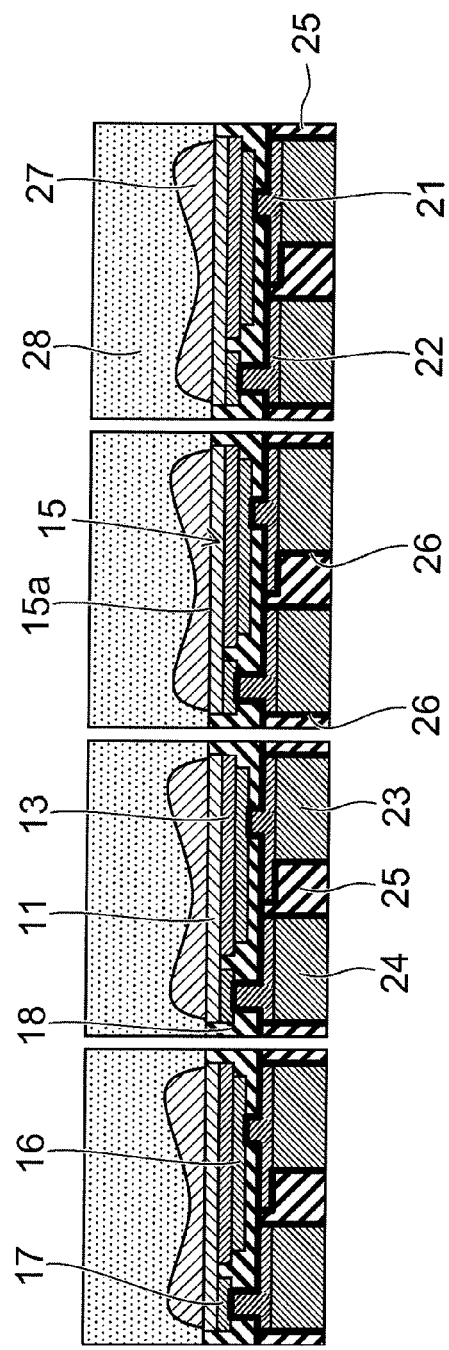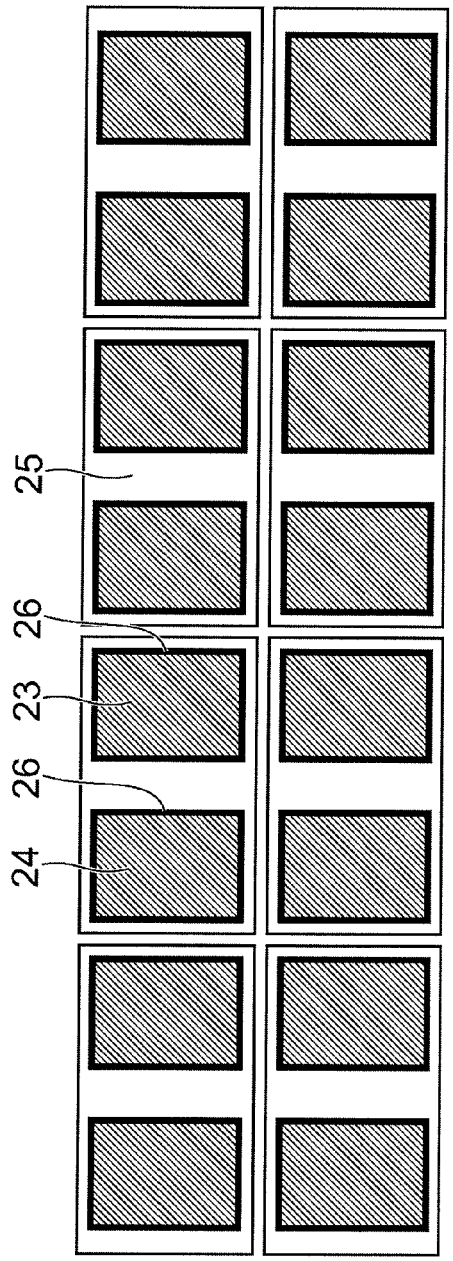
FIG. 12A
FIG. 12B

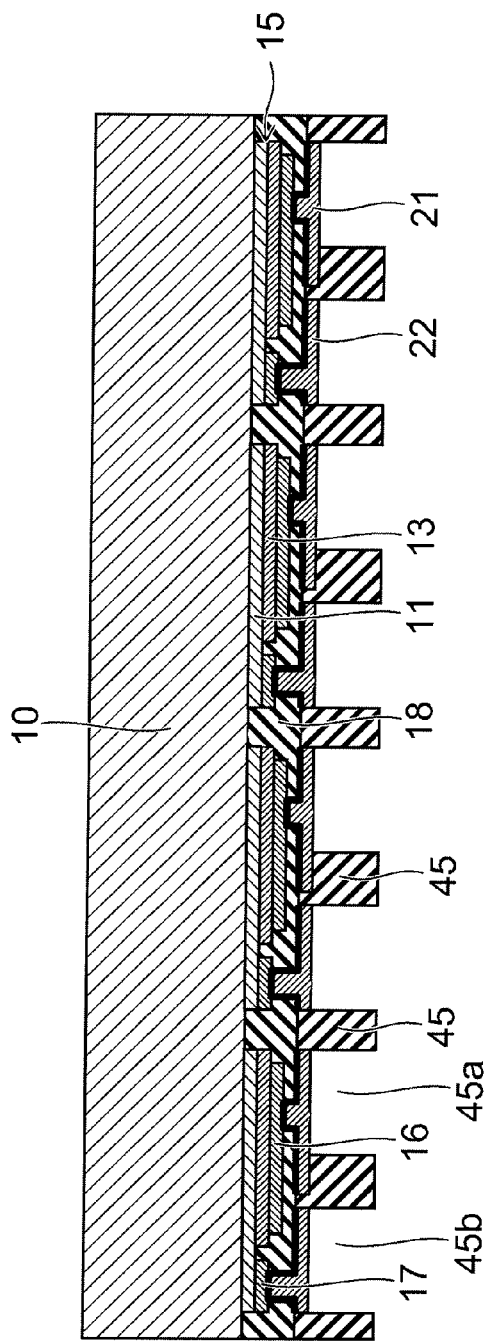
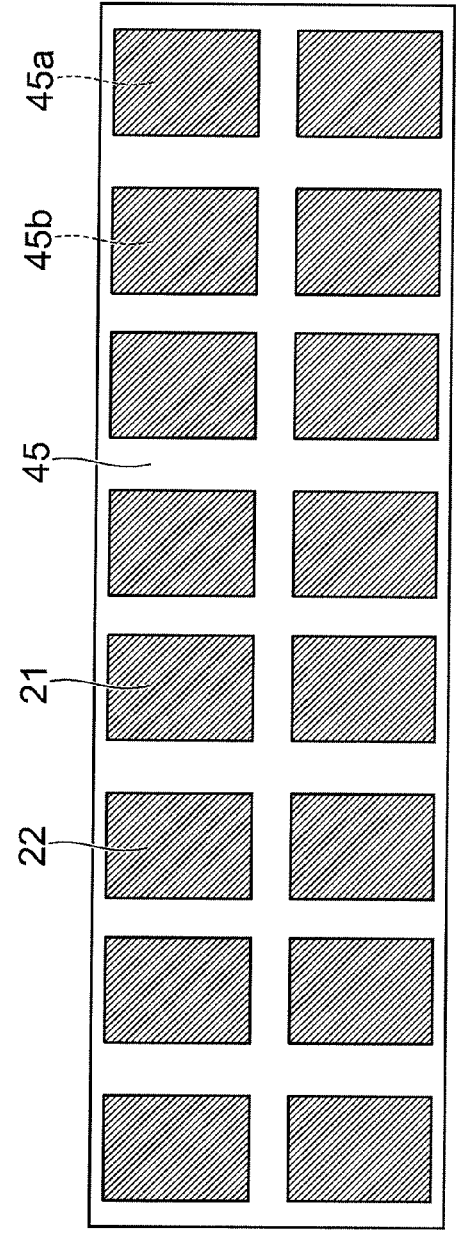
FIG. 17A
FIG. 17B

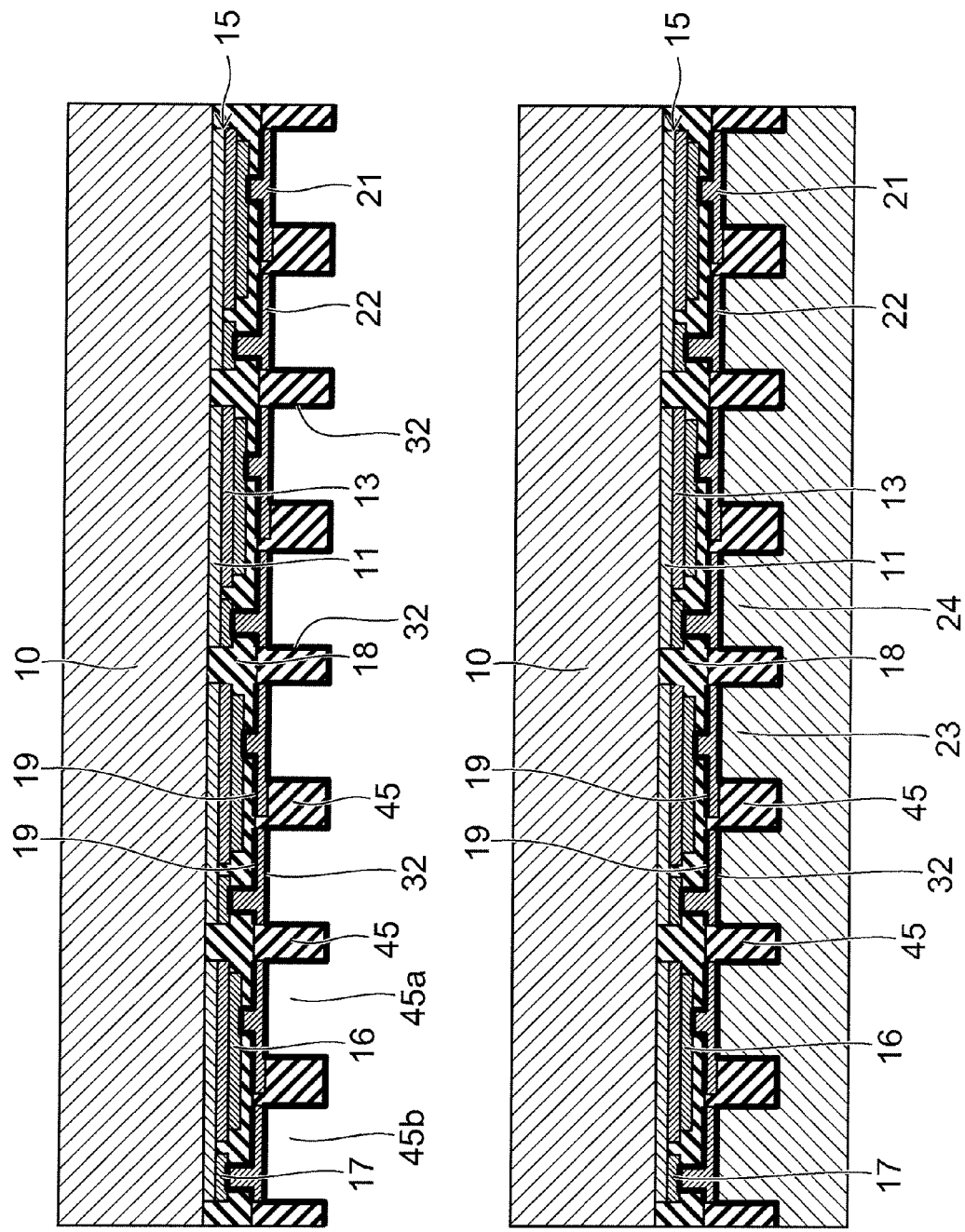

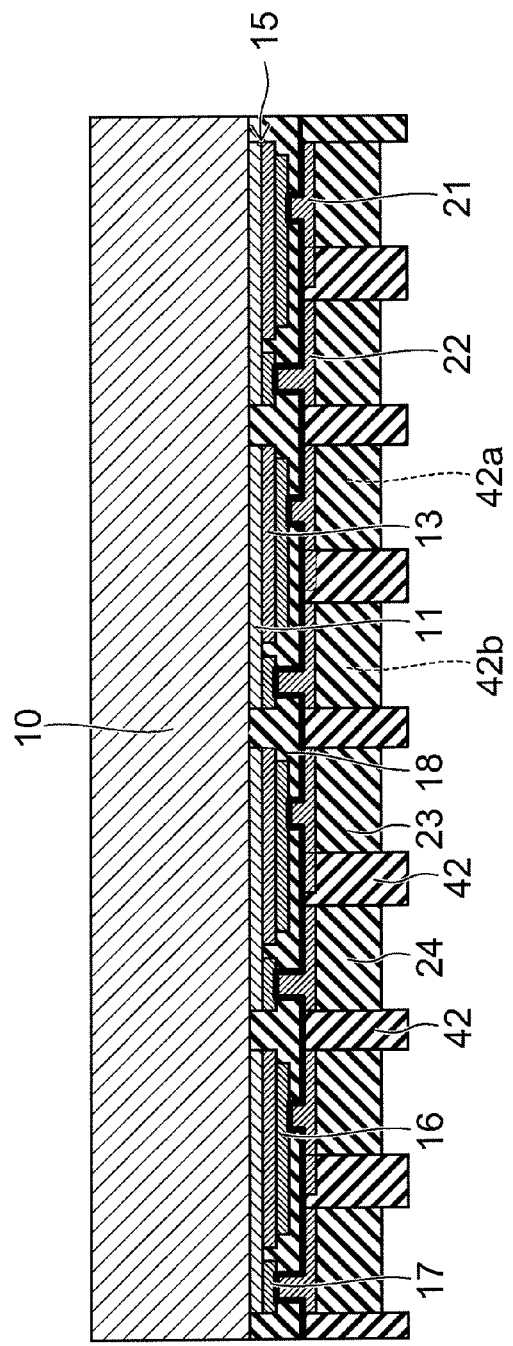
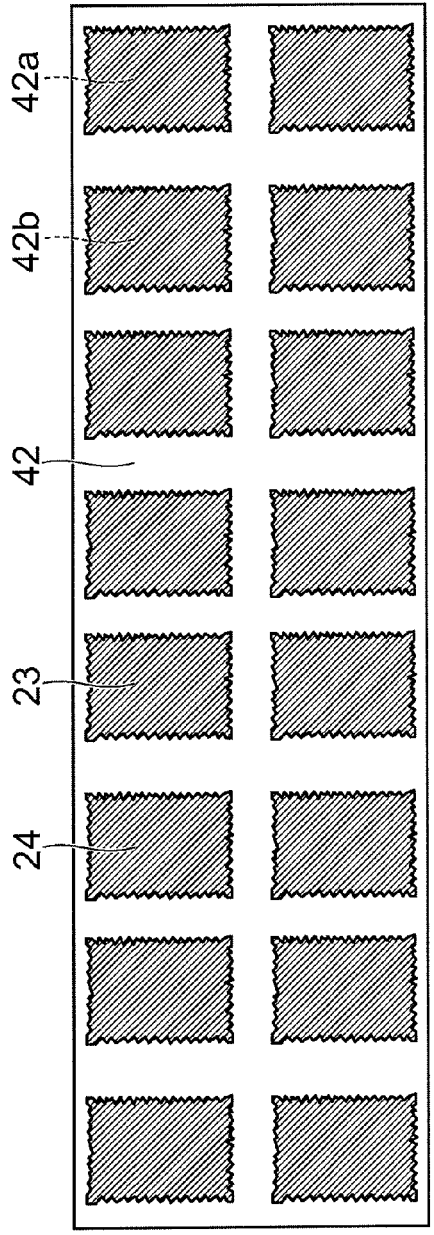
FIG. 22A
FIG. 22B

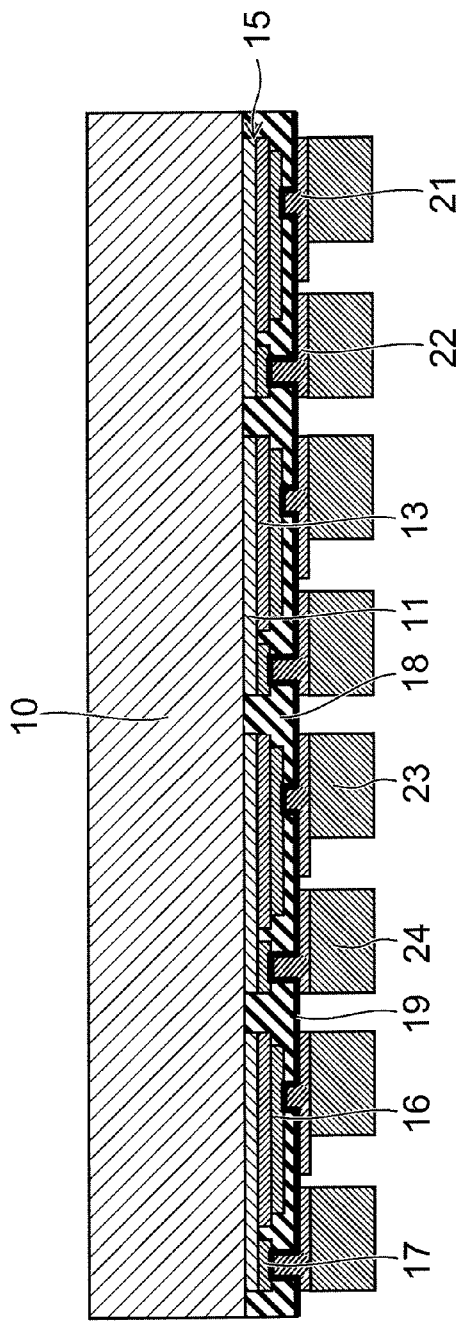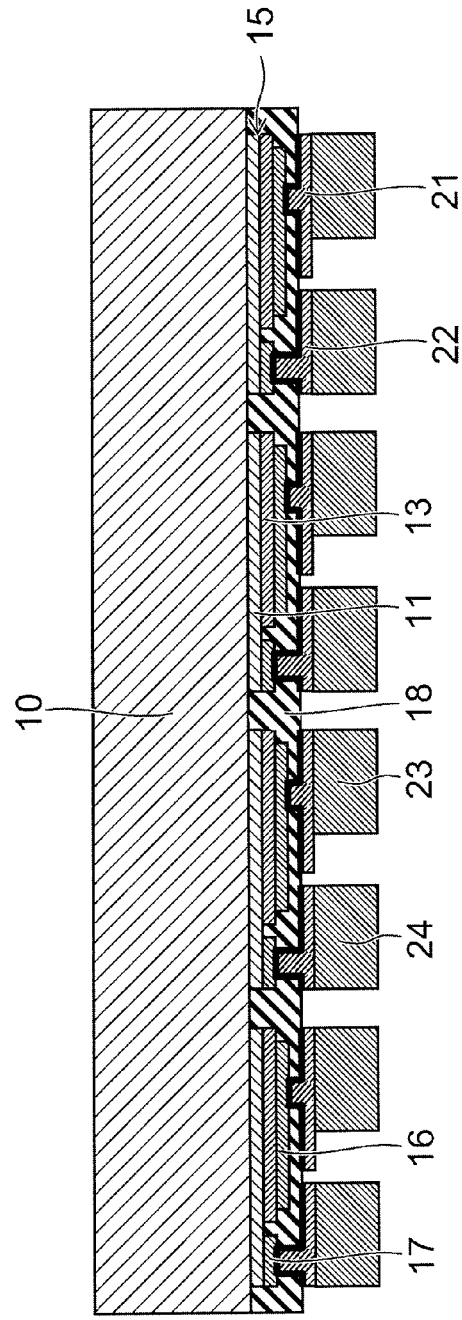

SEMICONDUCTOR LIGHT EMITTING DEVICE AND METHOD FOR MANUFACTURING SAME

CROSS-REFERENCE TO RELATED APPLICATION

This application is based upon and claims the benefit of priority from Japanese Patent Application No. 2010-118698, filed on May 24, 2010; the entire contents of which are incorporated herein by reference. This application is a divisional of U.S. application Ser. No. 12/880,673, filed on Sept. 13, 2010.

FIELD

Embodiments described herein relate generally to a semiconductor light emitting device and a method for manufacturing the same.

BACKGROUND

Known technology uses, for example, solder to perform flip chip mounting of an LED (Light Emitting Diode) chip in which an n-side electrode and a p-side electrode are formed on one major surface side of a semiconductor layer. In such a flip chip structure, it is desirable to downsize without harming reliability.

BRIEF DESCRIPTION OF THE DRAWINGS

FIG. 2A to FIG. 12B are diagrams illustrating a method for manufacturing the semiconductor light emitting device of the first embodiment;

FIG. 16A to FIG. 19B are diagrams illustrating a method for manufacturing the semiconductor light emitting device of the third embodiment;

FIG. 21A to FIG. 24B are diagrams illustrating a method for manufacturing the semiconductor light emitting device of the fourth embodiment;

DETAILED DESCRIPTION

Figure 1A:
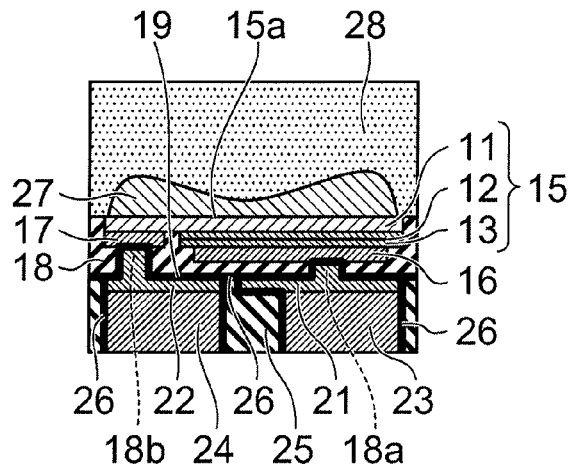
FIGS. 1A to 1C are diagrams of a semiconductor light emitting device of a first embodiment.

According to one embodiment, a semiconductor light emitting device includes a semiconductor layer, a first electrode, a second electrode, an insulating layer, a first interconnect layer, a second interconnect layer, a first metal pillar, a second metal pillar, a film covering a side face of the first metal pillar and a side face of the second metal pillar, and a resin layer. The semiconductor layer includes a light emitting layer, a first major surface, and a second major surface formed on a side opposite to the first major surface. The first electrode is provided on the second major surface in a region including the light emitting layer. The second electrode is provided on the second major surface. The insulating layer is provided on a side of the second major surface of the semiconductor layer. The insulating layer has a first opening reaching the first electrode and a second opening reaching the second electrode. The first interconnect layer is provided in the first opening and on a face of the insulating layer on a side opposite to the semiconductor layer to connect to the first electrode. The second interconnect layer is provided in the second opening and on a face of the insulating layer on a side opposite to the semiconductor layer to connect to the second electrode. The first metal pillar is provided on a face of the first interconnect layer on a side opposite to the first electrode. The second metal pillar is provided on a face of the second interconnect layer on a side opposite to the second electrode. The film has a solder wettability poorer than a solder wettability of the first metal pillar and a solder wettability of the second metal pillar. The resin layer is provided between the first metal pillar and the second metal pillar and covers at least part of the film.

Exemplary embodiments will now be described with reference to the drawings. Similar components in the drawings are marked with like reference numerals. Further, partial regions of the wafer state are illustrated in drawings illustrating processes.

First Embodiment

Figure 1B:
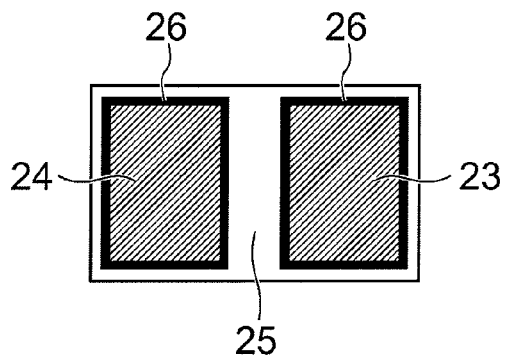

FIG. 1A is a schematic cross-sectional view of a semiconductor light emitting device of a first embodiment; and FIG. 1B is a bottom view thereof.

The semiconductor light emitting device of this embodiment has a structure in which electrodes and interconnect layers are provided on one major surface (a second major surface) side (lower side) of a semiconductor layer 15. Light is extracted mainly from a first major surface 15a on the side opposite to the second major surface.

The semiconductor layer 15 includes a first semiconductor layer 11 and a second semiconductor layer 13. The first semiconductor layer 11 is, for example, an n-type GaN layer that functions as a lateral current path. However, the conductivity type of the first semiconductor layer 11 is not limited to the n-type; and the conductivity type may be a p-type. The second semiconductor layer 13 has a stacked structure in which a light emitting layer (an active layer) 12 is interposed between an n-type layer and a p-type layer.

The second major surface side of the semiconductor layer 15 is patterned into a recessed and protruding configuration to provide an upper level portion and a lower level portion on the second major surface side. The upper level portion, which is positioned more on the upper level side than is the lower level portion as viewed from the first major surface 15a, includes the light emitting layer 12. The lower level portion does not include the light emitting layer 12 and is provided outside the outer circumference of the light emitting layer 12.

A p-side electrode 16 is provided as a first electrode on the surface of the second interconnect layer 13, i.e., the surface of the upper level portion. In other words, the p-side electrode 16 is provided in a region including the light emitting layer 12. An n-side electrode 17 is provided as a second electrode on the surface of the first interconnect layer 11 of the lower level portion.

FIG. 2B illustrates one example of a planar layout of the p-side electrode 16 and the n-side electrode 17. In the semiconductor layer 15, the surface area of the p-side electrode 16 is greater than the surface area of the n-side electrode 17. Accordingly, a large light emitting region can be obtained.

As illustrated in FIG. 1A, an insulating layer 18 covers the second major surface side of the semiconductor layer 15. The insulating layer 18 also covers the end face (the side face) of the semiconductor layer 15. The insulating layer 18 is, for example, a resin such as polyimide having excellent patternability of ultra-fine openings. Alternatively, silicon oxide may be used as the insulating layer 18.

The face of the insulating layer 18 on the side opposite to the semiconductor layer 15 is planarized; and a p-side interconnect layer 21 is provided as a first interconnect layer and an n-side interconnect layer 22 is provided as a second interconnect layer on the planarized face. The p-side interconnect layer 21 is provided also in a first opening 18a made in the insulating layer 18 to reach the p-side electrode 16; and the p-side interconnect layer 21 is connected to the p-side electrode 16. The n-side interconnect layer 22 is provided also in a second opening 18b made in the insulating layer 18 to reach the n-side electrode 17; and the n-side interconnect layer 22 is connected to the n-side electrode 17.

A p-side metal pillar 23 is provided as a first metal pillar on the face of the p-side interconnect layer 21 on the side opposite to the p-side electrode 16. An n-side metal pillar 24 is provided as a second metal pillar on the face of the n-side interconnect layer 22 on the side opposite to the n-side electrode 17.

An insulating film 26 is formed on the side face of the p-side metal pillar 23 and the side face of the n-side metal pillar 24. The p-side metal pillar 23 and the n-side metal pillar 24, for example, are made of copper or include mainly copper. The solder wettability of the insulating film 26 is poorer than that of copper. Solder wettability refers to the property of solder where the solder melted on a metal surface spreads without being repelled. For example, the insulating film 26 is an inorganic film such as a silicon oxide film, a silicon nitride film, etc.

As illustrated in FIG. 1B, the insulating film 26 continuously covers the periphery of the side face of the p-side metal pillar 23 and the periphery of the side face of the n-side metal pillar 24. The insulating film 26 is formed also on a portion on the insulating layer 18 between the p-side interconnect layer 21 and the n-side interconnect layer 22.

A resin layer 25 covers the n-side interconnect layer 22, the p-side interconnect layer 21, and the periphery of the insulating film 26. The resin layer 25 is filled between the p-side metal pillar 23 and the n-side metal pillar 24 and reinforces the p-side metal pillar 23 and the n-side metal pillar 24. The lower face of the p-side metal pillar 23 and the lower face of the n-side metal pillar 24 are exposed from the resin layer 25.

The contact surface area between the n-side interconnect layer 22 and the n-side metal pillar 24 is greater than the contact surface area between the n-side interconnect layer 22 and the n-side electrode 17.

In other words, the surface area of the n-side interconnect layer 22 connected to the n-side electrode 17 provided on the portion of the semiconductor layer 15 not including the light emitting layer 12 is greater at the face on the side opposite to the n-side electrode 17 than at the face on the n-side electrode 17 side. Further, a portion of the n-side interconnect layer 22 extends over the insulating layer 18 to an overlaying position below the light emitting layer 12.

Thereby, a larger draw out electrode can be formed via the n-side interconnect layer 22 from the n-side electrode 17 provided on a portion of the semiconductor layer 15 not including the light emitting layer 12 and having a small surface area while maintaining a high light output by having a larger light emitting layer 12.

The first semiconductor layer 11 is electrically connected to the n-side metal pillar 24 via the n-side electrode 17 and the n-side interconnect layer 22. The second semiconductor layer 13 is electrically connected to the p-side metal pillar 23 via the p-side electrode 16 and the p-side interconnect layer 21.

Figure 1C:
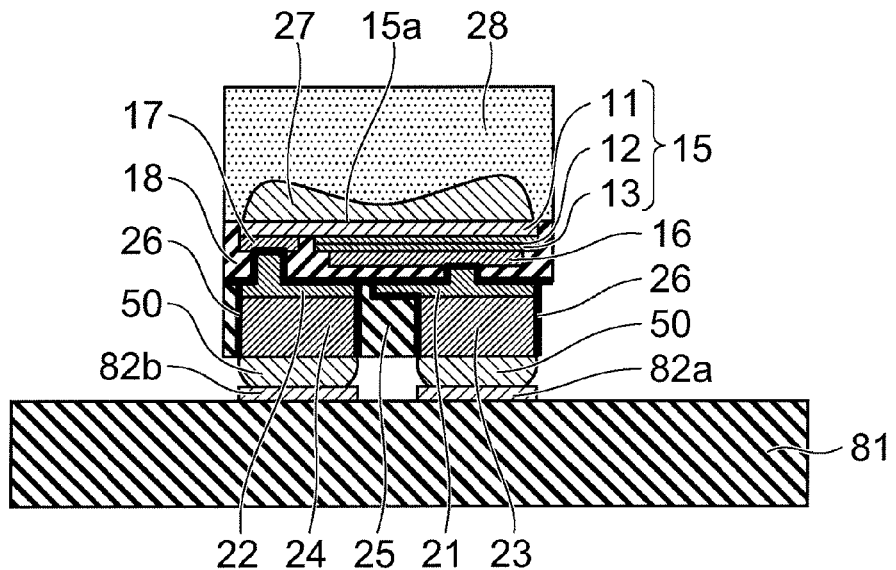

As illustrated in FIG. 1C, external terminals such as, for example, solder 50 having ball configurations are provided on the lower faces of the n-side metal pillar 24 and the p-side metal pillar 23 exposed from the resin layer 25. The semiconductor light emitting device is electrically connectable to the external circuit via the solder 50 and the pads 82a and 82b, interconnects, etc., formed on a mounting substrate 81. The solder 50 includes, for example, tin (Sn), silver (Ag), bismuth (Bi), copper (Cu), etc.

Alternatively, the lower faces of the n-side metal pillar 24 and the p-side metal pillar 23 may be covered with an inert metal, e.g., gold and the like. In such a case, the semiconductor light emitting device is mounted on the mounting substrate 81 on which solder paste is printed; and the solder wets onto the gold surface to make the connection. Also, it is possible to cover the lower faces of the n-side metal pillar 24 and the p-side metal pillar 23 with nonvolatile organic thin films called OSP (organic solderbility preservatives). In such a case, the connection is made by the solder wetting onto a copper surface where oxidation is suppressed by being covered with the OSP.

Each of the thickness of the n-side metal pillar 24 and the thickness of the p-side metal pillar 23 (the thickness in the vertical direction in FIG. 1A) is thicker than the thickness of a stacked body including the semiconductor layer 15, the n-side electrode 17, the p-side electrode 16, the insulating layer 18, the n-side interconnect layer 22, and the p-side interconnect layer 21. The aspect ratios of the metal pillars 23 and 24 (the ratio of the thickness to the planar size) are not limited to 1 or more; and the ratios may be less than 1. In other words, the thicknesses of the metal pillars 23 and 24 may be smaller than the planar sizes thereof.

According to the structure of this embodiment, it is possible to maintain the mechanical strength even in the case where the semiconductor layer 15 is thin by increasing the thicknesses of the n-side metal pillar 24, the p-side metal pillar 23, and the resin layer 25. In the case of mounting on the mounting substrate 81, the n-side metal pillar 24 and the p-side metal pillar 23 can absorb and mitigate the stress applied to the semiconductor layer 15 via the solder 50.

The materials of the n-side interconnect layer 22, the p-side interconnect layer 21, the n-side metal pillar 24, and the p-side metal pillar 23 may include copper, gold, nickel, silver, etc. Thereof, copper is more favorable because copper provides good thermal conductivity, high migration resistance, and excellent adhesion with insulating films.

It may be possible for the resin layer 25, which performs the role of reinforcing the n-side metal pillar 24 and the p-side metal pillar 23, to be a substance having a coefficient of thermal expansion equal to or near that of the mounting substrate 81. Examples of such a resin layer 25 may include, for example, epoxy resin, silicone resin, fluorocarbon resin, etc.

A lens 27 and a fluorescent layer 28 are provided on the first major surface 15a of the semiconductor layer 15. The fluorescent layer 28 is capable of absorbing light from the light emitting layer 12 and emitting wavelength-converted light. Therefore, it is possible to emit mixed light of the light from the light emitting layer 12 and the wavelength-converted light of the fluorescent layer 28. In the case where, for example, the light emitting layer 12 is nitride-based, it is possible to obtain white light, lamp light, etc., as mixed-color light of blue light from the light emitting layer 12 and yellow light from, for example, the wavelength-converted light of a yellow fluorescent layer 28. The fluorescent layer 28 may have a configuration including multiple types of phosphors (e.g., a red phosphor and a green phosphor).

The light emitted by the light emitting layer 12 travels mainly through the first semiconductor layer 11, the first major surface 15a, the lens 27, and the fluorescent layer 28 to be emitted externally.

A method for manufacturing the semiconductor light emitting device of this embodiment will now be described with reference to FIG. 2A to FIG. 12B.

First, the first semiconductor layer 11 is formed on the major surface of a substrate 10; and the second semiconductor layer 13 including the light emitting layer 12 is formed thereupon. In the case where such layers of the semiconductor layer 15 are, for example, nitride semiconductors, the semiconductor layer 15 may be formed by, for example, crystal growth on a sapphire substrate.

Then, as illustrated in FIG. 2A and FIG. 2B, which is the bottom view of FIG. 2A, a separating trench 14 is made to pierce the semiconductor layer 15 and reach the substrate 10 by, for example, Reactive Ion Etching (RIE) using a not-illustrated resist. The separating trench 14 is made, for example, in a lattice configuration on the substrate 10 to multiply separate the semiconductor layer 15.

A portion of the second semiconductor layer 13 including the light emitting layer 12 is removed by, for example, RIE using a not-illustrated resist to expose a portion of the first semiconductor layer 11. Thereby, the upper level portion is formed on the second major surface side of the semiconductor layer 15 to be positioned relatively in the upper level as viewed from the substrate 10; and the lower level portion is formed on the second major surface side of the semiconductor layer 15 to be positioned more in the lower level on the substrate 10 side than is the upper level portion. The upper level portion includes the light emitting layer 12; and the lower level portion does not include the light emitting layer 12.

Then, the p-side electrode 16 is formed on the surface of the upper level portion (the surface of the second semiconductor layer 13); and the n-side electrode 17 is formed on the surface of the lower level portion (the surface of the first semiconductor layer 11). Either the p-side electrode 16 or the n-side electrode 17 may be formed prior to the other; or, the p-side electrode 16 and the n-side electrode 17 may be formed simultaneously from the same material.

Then, after covering the exposed portions of the substrate 10 with the insulating layer 18, the insulating layer 18 is patterned as illustrated in FIG. 3A by, for example, wet etching to make the first opening 18a and the second opening 18b selectively in the insulating layer 18. The first opening 18a reaches the p-side electrode 16. The second opening 18b reaches the n-side electrode 17. The insulating layer 18 is filled into the separating trench 14.

Then, as illustrated in FIG. 3B, a continuous seed metal 19 is formed on the surface of the insulating layer 18 and on the inner faces of the first opening 18a and the second opening 18b. Further, a resist 41 is formed selectively on the seed metal 19; and Cu electroplating is performed using the seed metal 19 as a current path.

Figure 4A:
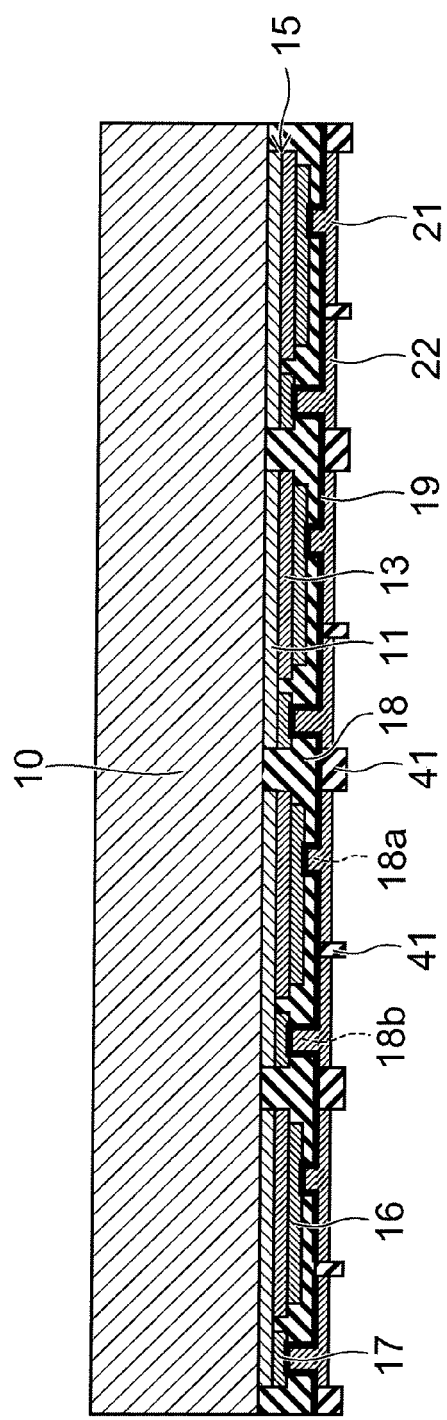
Figure 4B:
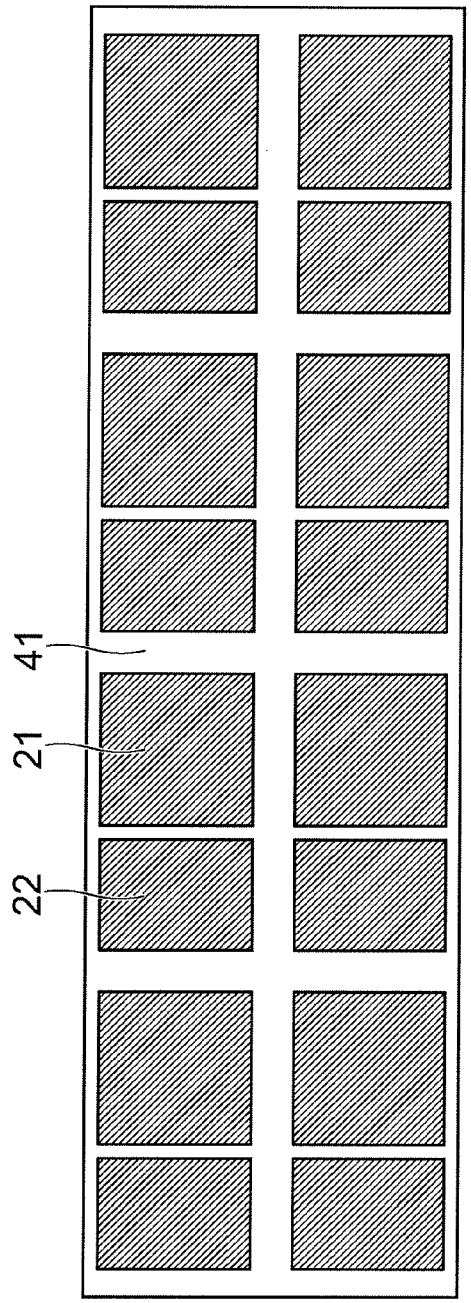

Thereby, as illustrated in FIG. 4A and FIG. 4B, i.e., the bottom view of FIG. 4A, the p-side interconnect layer 21 and the n-side interconnect layer 22 are formed selectively on the seed metal 19. The p-side interconnect layer 21 and the n-side interconnect layer 22 are made of a copper material formed simultaneously by plating. The p-side interconnect layer 21 is formed also in the first opening 18a to connect to the p-side electrode 16 via the seed metal 19. The n-side interconnect layer 22 is formed also in the second opening 18b to connect to the n-side electrode 17 via the seed metal 19.

The face of the n-side interconnect layer 22 on the side opposite to the n-side electrode 17 is formed in a pad configuration on the surface of the insulating layer 18 and has a surface area greater than that of the face of the n-side interconnect layer 22 connected to the n-side electrode 17. The face of the p-side interconnect layer 21 on the side opposite to the p-side electrode 16 is formed in a pad configuration on the surface of the insulating layer 18 and has a surface area greater than the surface area of the face of the p-side interconnect layer 21 connected to the p-side electrode 16.

The resist 41 used during the plating of the p-side interconnect layer 21 and the n-side interconnect layer 22 is removed with, for example, a chemical solution (FIG. 5A). Subsequently, as illustrated in FIG. 5B, another resist 42 is formed for forming the metal pillars; and Cu electroplating is performed using the seed metal 19 as a current path. The resist 42 is thicker than the resist 41.

Figure 6A:
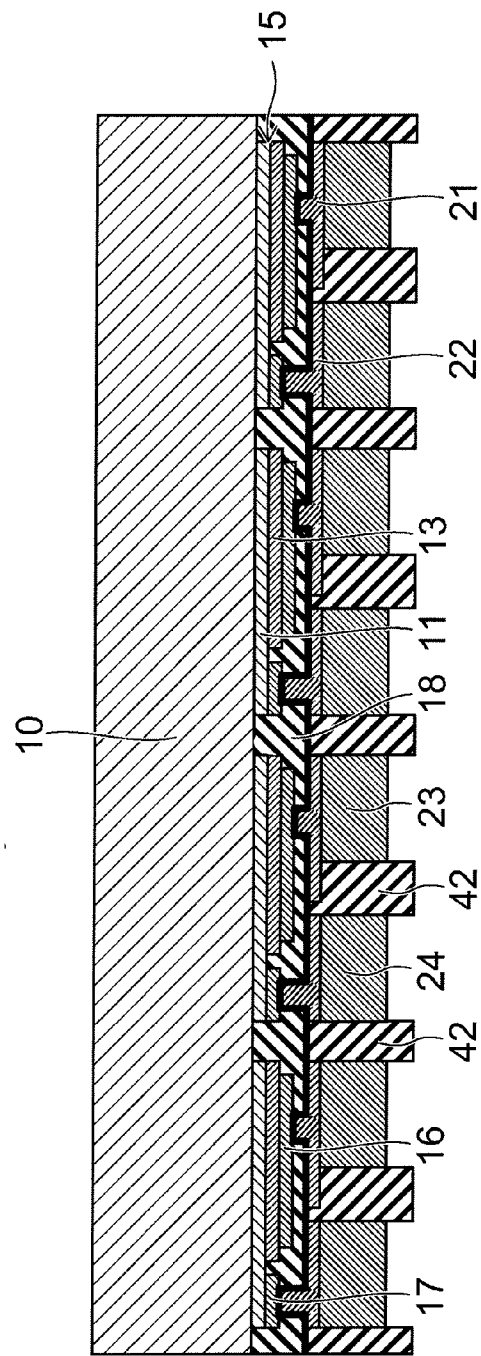
Figure 6B:
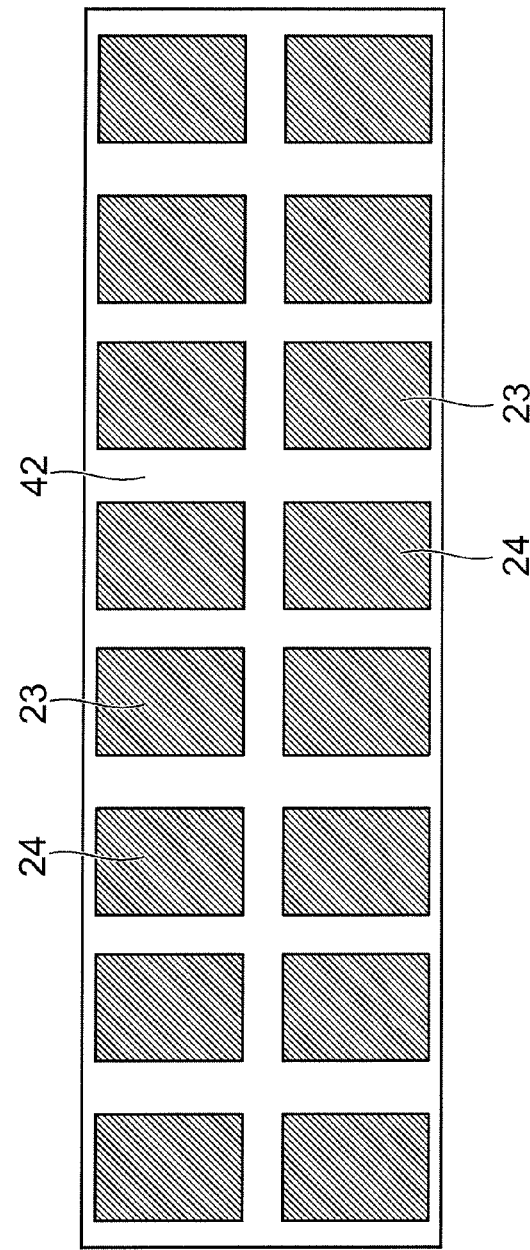

Thereby, as illustrated in FIG. 6A and FIG. 6B, i.e., the bottom view of FIG. 6A, the p-side metal pillar 23 is formed on the p-side interconnect layer 21; and the n-side metal pillar 24 is formed on the n-side interconnect layer 22. The p-side metal pillar 23 and the n-side metal pillar 24 are made of a copper material formed simultaneously by plating.

The resist 42 is removed with, for example, a chemical solution (FIG. 7A). Subsequently, wet etching is performed on the exposed portions of the seed metal 19 using the p-side metal pillar 23 and the n-side metal pillar 24 as a mask (FIG. 7B). Thereby, the electrical connection between the p-side interconnect layer 21 and the n-side interconnect layer 22 via the seed metal 19 is divided.

Then, the insulating film 26 is formed on the exposed portions on the substrate 10 by, for example, chemical vapor deposition (CVD) or physical vapor deposition (PVD) such as sputtering. As illustrated in FIG. 8A, the insulating film 26 covers the side face of the p-side metal pillar 23 and the lower face thereof and the side face of the n-side metal pillar 24 and the lower face thereof. The insulating film 26 surrounds side surfaces of the p-side metal pillar 23 and the n-side metal pillar 24. The insulating film 26 is formed also on the surface of the insulating layer 18 in the portions where the seed metal 19 is removed. Side surfaces of the p-side interconnect layer 21 and the n-side interconnect layer 22 are surrounded by the insulating film 26. A portion of a lower surface of the p-side interconnect layer 21 which is not provided below the p-side metal pillar 23, is covered with the insulating film 26.

Then, as illustrated in FIG. 8B, the resin layer 25 is stacked on the insulating layer 18. The resin layer 25 covers the portions covered with the insulating film 26. In other words, the resin layer 25 is filled between the p-side interconnect layer 21 and the n-side interconnect layer 22, and between the p-side metal pillar 23 and the n-side metal pillar 24. The resin layer 25 covers the periphery of the p-side metal pillar 23 and the periphery of the n-side metal pillar 24 via the insulating film 26.

Figures 9A, 9B:
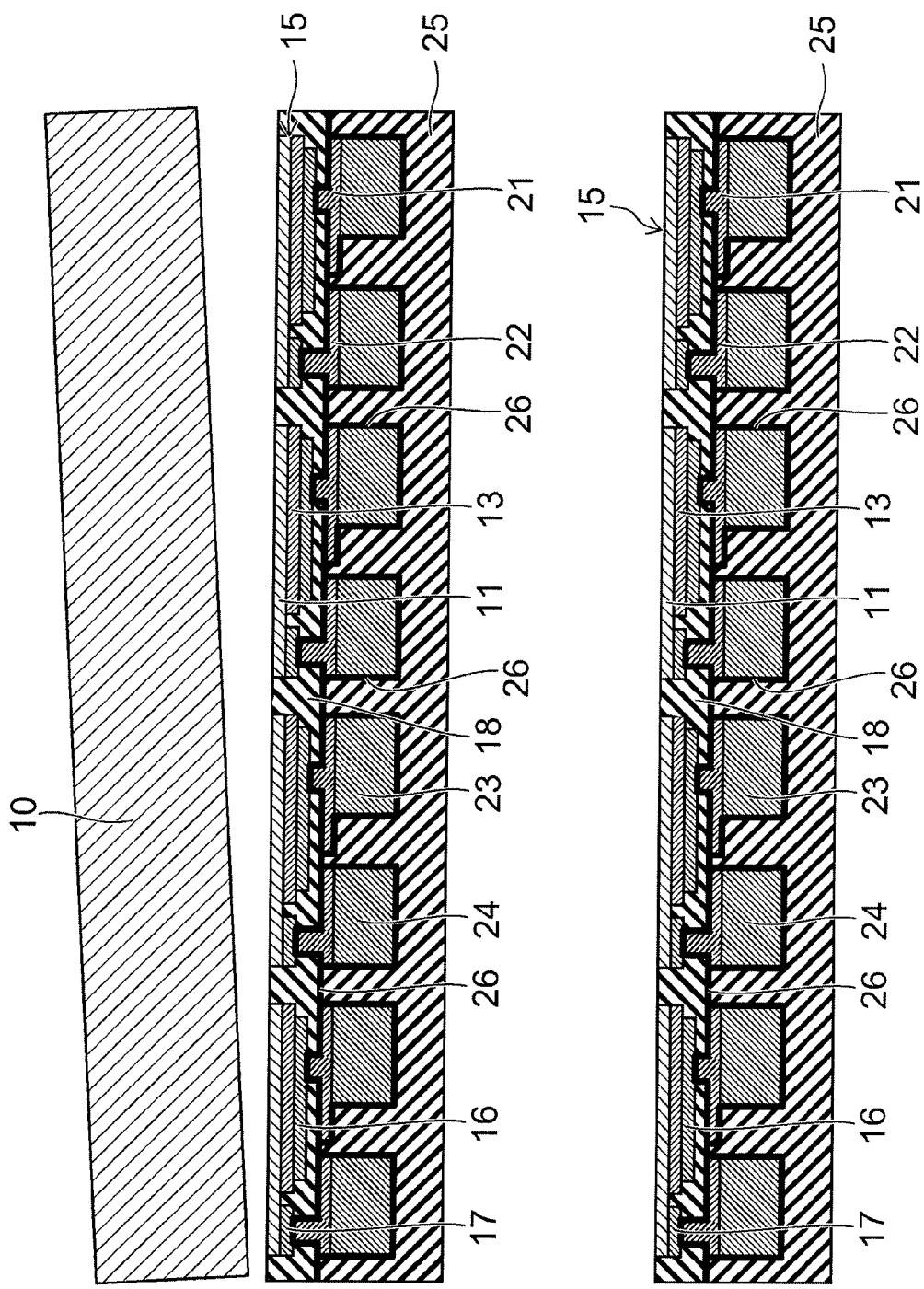

Subsequently, the substrate 10 is removed as illustrated in FIG. 9A and FIG. 9B. The substrate 10 may be removed by, for example, laser lift-off. Specifically, laser light is irradiated from the backside of the substrate 10 toward the first semiconductor layer 11. The substrate 10 is permeable to laser light; and the laser light has a wavelength in the absorption region of the first semiconductor layer 11.

When the laser light reaches the interface between the substrate 10 and the first semiconductor layer 11, the first semiconductor layer 11 proximal to the interface absorbs the energy of the laser light and decomposes. For example, in the case where the first semiconductor layer 11 is GaN, the first semiconductor layer 11 decomposes into Ga and nitrogen gas. A micro gap is formed between the substrate 10 and the first semiconductor layer 11 by the decomposition reaction; and the substrate 10 and the first semiconductor layer 11 separate.

The irradiation of the laser light is performed over the entire wafer by performing multiply for each set region; and the substrate 10 is removed. The light extraction efficiency can be increased by removing the substrate 10 from the first major surface 15a.

The face where the substrate 10 is removed is cleaned; and surface roughening is performed by frosting. The light extraction efficiency can be increased by roughening the first major surface 15a.

Here, the layer made of the resin and the metal is flexible, and the metal is formed by plating at near room temperature. Hence, the residual stress occurring with respect to the translucent substrate 10 is relatively low.

In the conventional technique for separating the semiconductor layer from the translucent substrate at wafer level, for example, it is bonded to a silicon substrate with a metal layer formed thereon using Au—Sn solder at a high temperature of 300° C. or more, and then the semiconductor layer made of GaN is separated by laser irradiation. However, in this conventional technique, the translucent substrate and the silicon substrate being different in thermal expansion coefficient are both rigid, and are bonded together at high temperature. Hence, a high residual stress remains between these substrates. Consequently, when the separation is started by laser irradiation, the residual stress is locally relieved from the separated portion and unfortunately causes cracks in the thin, brittle semiconductor layer.

In contrast, in this embodiment, the residual stress is low, and the semiconductor layer 15 is separated in the state of being fixed to a flexible support. Hence, the device can be manufactured at high yield without trouble such as cracking in the semiconductor layer 15.

Subsequently, the lens 27 is formed on the first major surface 15a as illustrated in FIG. 10A; and the fluorescent layer 28 is formed on the lens 27 as illustrated in FIG. 10B. The fluorescent layer 28 may be formed, for example, by coating a liquid transparent resin in which phosphor particles are dispersed by spin coating and then thermosetting.

Subsequently, the back (bottom) face of the resin layer 25 is polished. The insulating film 26 formed on the lower face of the p-side metal pillar 23 and the lower face of the n-side metal pillar 24 is removed. Thereby, as illustrated in FIG. 11A and FIG. 11B, which is the bottom view of FIG. 11A, the lower face of the p-side metal pillar 23 and the lower face of the n-side metal pillar 24 are exposed.

Subsequently, singulation into multiple semiconductor light emitting devices (FIGS. 12A and 12B) is performed by dicing at the position of the separating trench 14 (FIGS. 2A and 2B). The substrate 10 is already removed during the dicing. Further, the dicing is easy because the semiconductor layer 15 does not exist in the separating trench 14 and a resin is filled as an insulating layer in the separating trench 14 beforehand; and the productivity can be increased. Further, damage to the semiconductor layer 15 during the dicing can be avoided. Also, a structure is obtained after singulation in which the end portion (the side face) of the semiconductor layer 15 is covered with resin and protected.

The singulated semiconductor light emitting device may have a single-chip structure including one semiconductor layer 15 or a multi-chip structure including multiple semiconductor layers 15.

Figure 26:
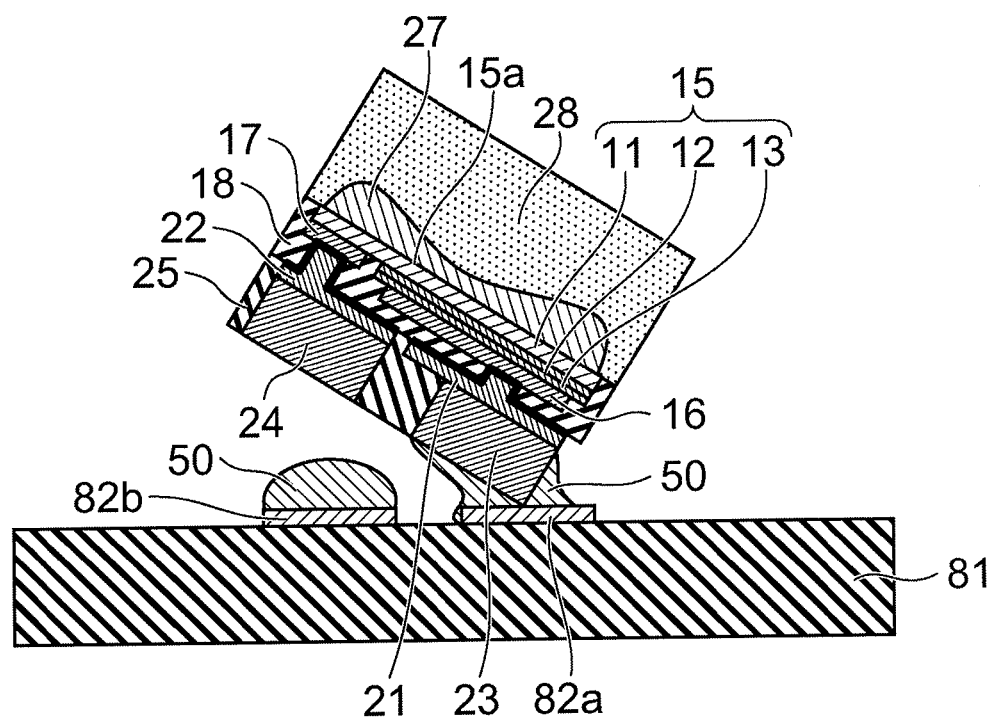
FIG. 26 is a diagram illustrating a tombstone defect during mounting.

Turning now to FIG. 26, a mounting defect of the structure of a comparative example in which the side face of the p-side metal pillar 23 and the side face of the n-side metal pillar 24 are directly covered with the resin layer 25. FIG. 26 illustrates the state in which a portion of the resin layer 25 peels during the dicing and, for example, the side face of the p-side metal pillar 23 is exposed.

When the solder 50 melts during the reflow of the mounting in such a state, a tombstone defect may occur in which the solder 50 wets and creeps up onto the exposed pillar side face and the device tilts such that one of the pillar sides (in this case, the n-side metal pillar 24) rises up. Such a raised n-side metal pillar 24 is not bonded to the pad 82b. Generally, an metal has a better solder wettability than insulating materials. Therefore, the solder so wets and creeps up easier onto the exposed the p-side metal pillar 23, with compare to the resin layer 25.

In case copper is used for the p-side metal pillar 23 and the n-side metal pillar 24 considering the heat dissipation, costs, process stability due to plating, etc. However, solder has extremely good copper wettability; and tombstone defects easily occur. This is not limited to the case Cu is used as the metal pillar.

Even in the case where normal mounting is performed, the pillar side face which is a conductive surface is exposed. Therefore, electrical defects such as shorts due to dirt occur easily.

In this embodiment, the insulating film 26 covers the side face of the p-side metal pillar 23 and the side face of the n-side metal pillar 24. Accordingly, even in the case where chipping and peeling of the resin layer 25 occur during and/or after the dicing, the side face of the p-side metal pillar 23 and the side face of the n-side metal pillar 24 are not exposed. Further, the insulating film 26 is an inorganic film having a solder wettability poorer than that of the metal (e.g., copper) included in the p-side metal pillar 23 and the n-side metal pillar 24. Therefore, the wetting of the solder 50 upward onto the insulating film 26 of the pillar side face can be suppressed even in the case where the insulating film 26 is exposed during the reflow of the solder 50. As a result, bonding defects, shorts due to contamination, etc., can be avoided.

By forming the insulating film 26 from an inorganic film such as a silicon oxide film, a silicon nitride film, etc., formed by, for example, CVD or PVD, the side face of the p-side metal pillar 23 and the side face of the n-side metal pillar 24 can be continuously covered reliably by stable processes.

The separating trench 14 which is in the dicing region is an ineffective region where the device is not formed; and it is good for the width to be as small as possible. Also, it is good for the cross-sectional areas (the planar sizes) of the p-side metal pillar 23 and the n-side metal pillar 24 to be large to increase the heat dissipation of the semiconductor light emitting device. In the case where the separating trench 14 is smaller and the cross-sectional areas of the p-side metal pillar 23 and the n-side metal pillar 24 are larger, the thickness of the resin layer 25 covering the side faces of the p-side metal pillar 23 and the n-side metal pillar 24 on the dicing region side becomes thin; and the pillar side faces are exposed easily due to chipping and peeling during and/or after the dicing.

However, in this embodiment, even in the case where chipping and peeling of the resin layer 25 occur, it is the insulating film 26 that is exposed; and mounting defects and short defects can be avoided. Accordingly, the thickness of the resin layer 25 covering the side face of the p-side metal pillar 23 and the side face of the n-side metal pillar 24 need not be thicker than necessary. As a result, the width of the dicing region can be narrower; and the number of chips per wafer can be increased. Further, the cross-sectional area of the pillars and the solder bonded thereto can be increased. Therefore, the heat dissipation can be increased.

Because the processes described above up to the dicing are performed collectively in the wafer state, it is unnecessary to perform interconnections and packaging for each of the singulated devices; and it is possible to reduce production costs. In other words, the interconnections and the packaging are already complete in the singulated state. Moreover, downsizing is easy in the case where the planar size of each device approaches the planar size of the bare chip (the semiconductor layer 15). Also, inspections are possible at the wafer level. Therefore, the productivity can be increased. As a result, cost reductions are easy.

Second Embodiment

Figure 13A:
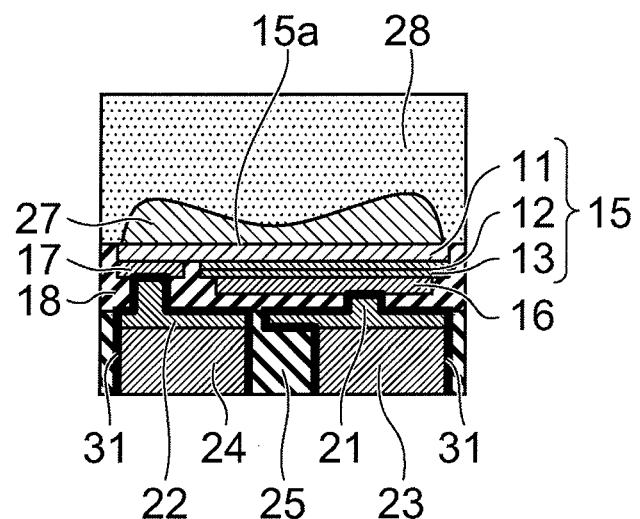
FIGS. 13A and 13B are diagrams of a semiconductor light emitting device of a second embodiment.
Figure 13B:
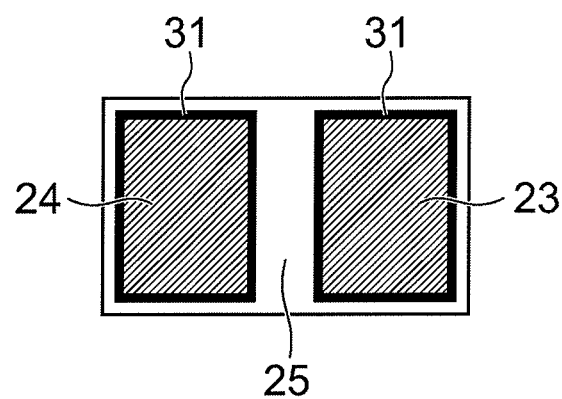

FIG. 13A is a schematic cross-sectional view of a semiconductor light emitting device of a second embodiment; and FIG. 13B is a bottom view thereof.

In this embodiment, an insulating film 31 is formed on the side face of the p-side metal pillar 23 and the side face of the n-side metal pillar 24. The p-side metal pillar 23 and the n-side metal pillar 24, for example, are made of copper or include mainly copper. The insulating film 31 is a black oxide of the copper ($Cu_2O$). The solder wettability of the insulating film 31 is poorer than that of copper. As illustrated in FIG. 13B, the insulating film 31 continuously covers the periphery of the side face of the p-side metal pillar 23 and the periphery of the side face of the n-side metal pillar 24. The resin layer 25 covers the n-side interconnect layer 22, the p-side interconnect layer 21, and the periphery of the insulating film 31. The insulating film 31 surrounds side surfaces of the p-side metal pillar 23 and the n-side metal pillar 24. Side surfaces of the p-side interconnect layer 21 and the n-side interconnect layer 22 are surrounded by the insulating film 31. A portion of a lower surface of the p-side interconnect layer 21 which is not provided below the p-side metal pillar 23, is covered with the insulating film 31.

Covering films of cuprous oxide have excellent adhesion with resins; and the chipping and the peeling of the resin layer 25 during and/or after the dicing do not occur easily. Even in the case where the chipping and the peeling of the resin layer 25 occur, the side face of the p-side metal pillar 23 and the side face of the n-side metal pillar 24 are not exposed. The solder wettability of the insulating film 31 is poorer than that of the metal (e.g., copper) included in the p-side metal pillar 23 and the n-side metal pillar 24. Therefore, the wetting of the solder upward onto the insulating film 31 of the pillar side face is suppressed even in the case where the insulating film 31 is exposed during the reflow of the solder. As a result, bonding defects due to the tombstone phenomenon can be avoided. Moreover, because the film is an insulating film, shorts due to contamination and the like can be avoided.

The processes of the semiconductor light emitting device of this embodiment up to the process of FIG. 7B proceed similarly to those of the first embodiment described above.

Then, after the process of FIG. 7B, that is, after performing the wet etching of the exposed portions of the seed metal 19 to divide the electrical connection between the p-side interconnect layer 21 and the n-side interconnect layer 22 via the seed metal 19, the following processes are performed.

Figure 14A:
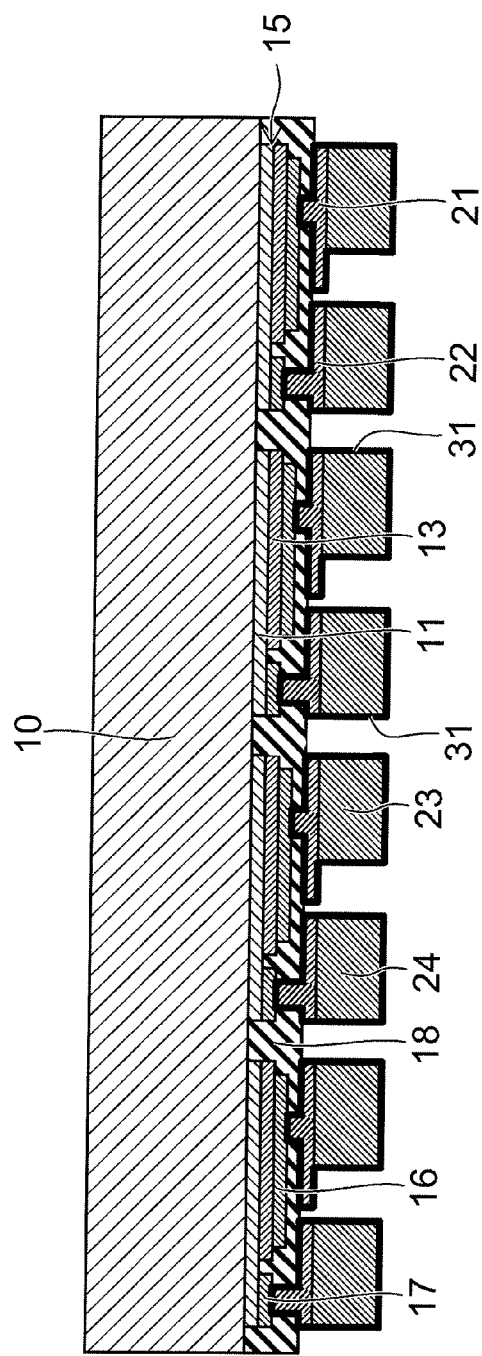
FIGS. 14A and 14B are diagrams illustrating a method for manufacturing the semiconductor light emitting device of the second embodiment.

For example, the wafer is immersed in mixed chemicals of sodium chlorite and sodium hydroxide to oxidize the exposed faces of the p-side metal pillar 23 and the n-side metal pillar 24. Thereby, as illustrated in FIG. 14A, the insulating film 31 of cuprous oxide, i.e., a film of black oxide of the copper, is formed on the side face of the p-side metal pillar 23 and the lower face thereof and the side face of the n-side metal pillar 24 and the lower face thereof.

Figure 14B:
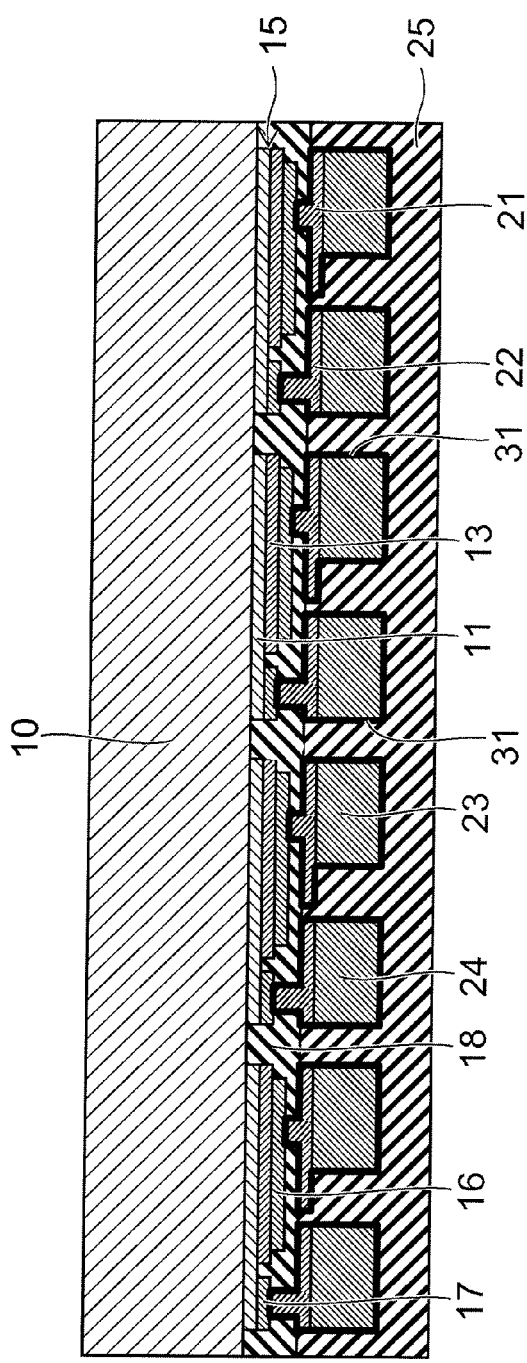

Then, as illustrated in FIG. 14B, the resin layer 25 is stacked on the insulating layer 18. Thereinafter, the processes proceed similarly to those of the first embodiment.

By polishing the back face of the resin layer 25 to remove the insulating film 31 formed on the lower face of the p-side metal pillar 23 and the lower face of the n-side metal pillar 24, the lower face of the p-side metal pillar 23 and the lower face of the n-side metal pillar 24 are exposed as illustrated in FIGS. 13A and 13B. The insulating film 31 has good adhesion to the p-side metal pillar 23 and the n-side metal pillar 24, since the insulating film 31 is reacted from the p-side metal pillar 23 and the n-side metal pillar 24.

Third Embodiment

Figure 15A:
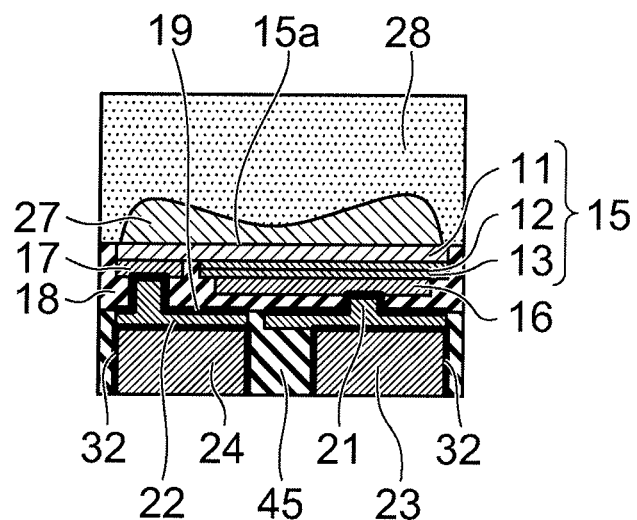
FIGS. 15A and 15B are diagrams of a semiconductor light emitting device of a third embodiment.
Figure 15B:
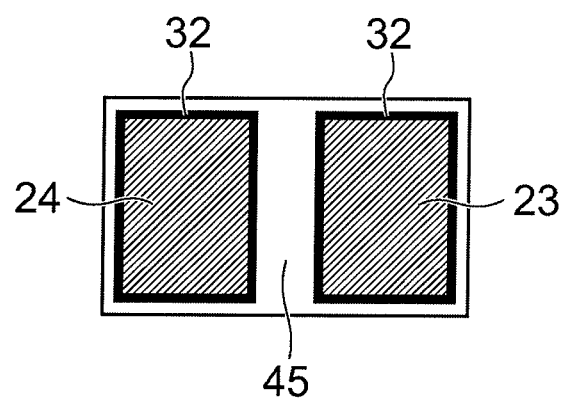

FIG. 15A is a schematic cross-sectional view of a semiconductor light emitting device of a third embodiment; and FIG. 15B is a bottom view thereof.

In this embodiment, a metal film 32 is formed on the side face of the p-side metal pillar 23 and the side face of the n-side metal pillar 24. The metal film 32 is made of a metal different from the p-side metal pillar 23 and the n-side metal pillar 24. The metal film 32 is a stacked film of, for example, a titanium (Ti) film and a nickel (Ni) film. The titanium film is formed on the side of the interface with the p-side interconnect layer 21, the n-side interconnect layer 22, and a resin layer 45; and the nickel film is formed on the titanium film. The solder wettability of titanium and the solder wettability of nickel are poorer than that of copper.

The metal film 32 is not limited to the stacked film of the titanium film and the nickel film. Only one film of either the titanium film or the nickel film may be used. Alternatively, another metal film having a solder wettability poorer than that of the copper included in the p-side metal pillar 23 and the n-side metal pillar 24 may be used.

As illustrated in FIG. 15B, the metal film 32 continuously covers the periphery of the side face of the p-side metal pillar 23 and the periphery of the side face of the n-side metal pillar 24. The resin layer 45 covers or surrounds the n-side interconnect layer 22, the p-side interconnect layer 21, and the periphery of the metal film 32. As described below, the resist used during the plating of the p-side metal pillar 23 and the n-side metal pillar 24 remains as-is to become the resin layer 45.

In this embodiment as well, the side face of the p-side metal pillar 23 and the side face of the n-side metal pillar 24 are covered with the metal film 32 and therefore are not exposed even in the case where the chipping and the peeling of the resin layer 45 occur. The metal film 32 has a solder wettability poorer than that of the metal (e.g., copper) included in the p-side metal pillar 23 and the n-side metal pillar 24. Therefore, the wetting of the solder upward onto the metal film 32 of the pillar side face can be suppressed even in the case where the metal film 32 is exposed during the reflow of the solder. As a result, the bonding defects due to the tombstone phenomenon can be avoided.

Figure 16A:
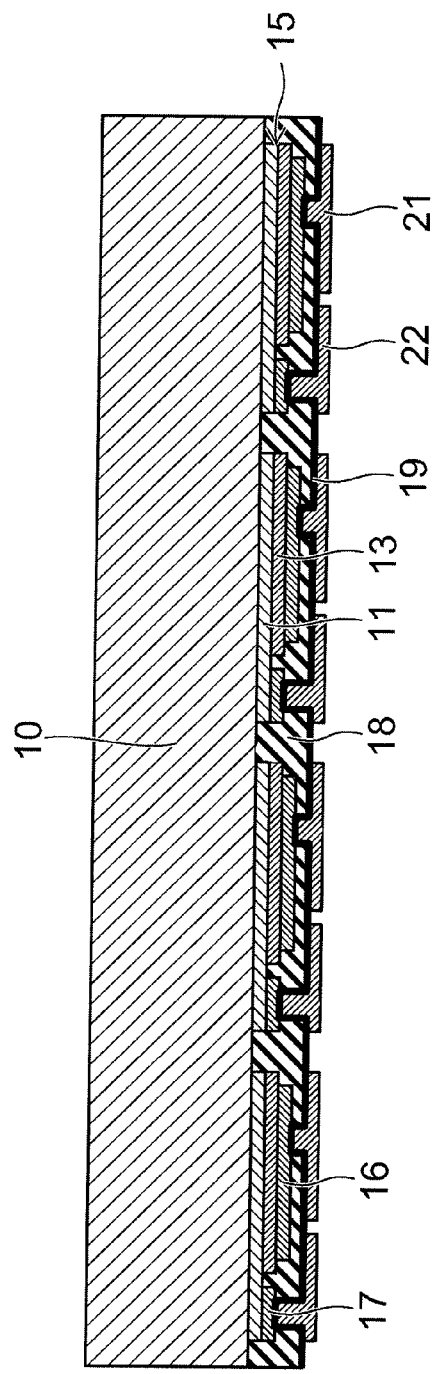

The semiconductor light emitting device of this embodiment up to the removal of the resist 41 used during the plating of the p-side interconnect layer 21 and the n-side interconnect layer 22 (FIG. 16A) proceeds similarly to the first embodiment described above.

Figure 16B:
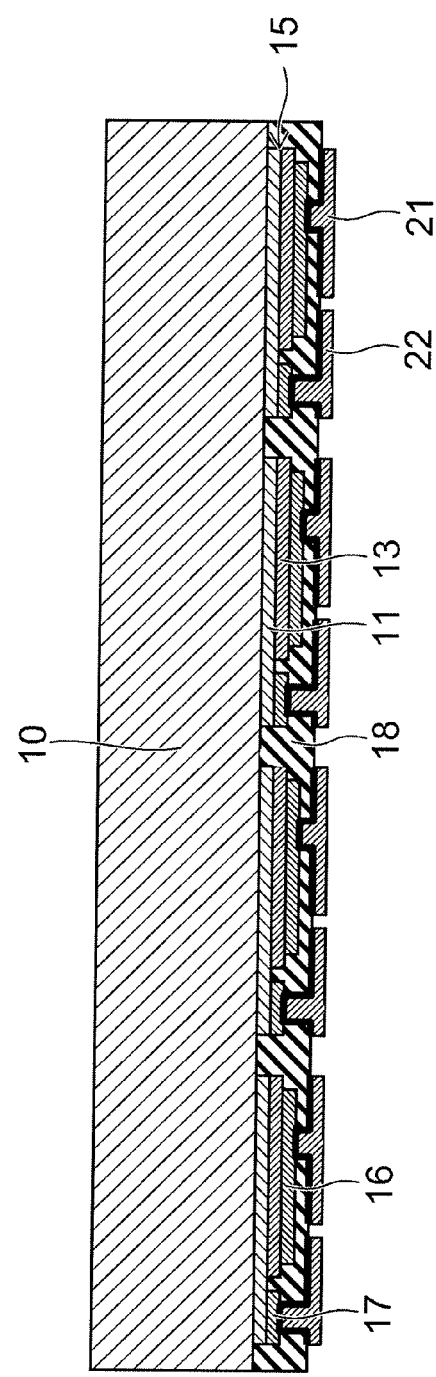

Subsequently, as illustrated in FIG. 16B, wet etching is performed on the exposed portions of the seed metal 19 using the p-side interconnect layer 21 and the n-side interconnect layer 22 as a mask. Thereby, the electrical connection between the p-side interconnect layer 21 and the n-side interconnect layer 22 via the seed metal 19 is divided.

Subsequently, as illustrated in FIG. 17A and FIG. 17B, i.e., the bottom view of FIG. 17A, the resin layer 45 also used as a plating resist is formed to cover the insulating layer 18, the p-side interconnect layer 21, and the n-side interconnect layer 22. Subsequently, openings 45a and 45b are made selectively. The opening 45a reaches the p-side interconnect layer 21; and the opening 45b reaches the n-side interconnect layer 22.

The resin layer 45 is cured and remains after the plating as well. Accordingly, a durable material for reliability may be used as a reinforcing resin of the p-side metal pillar 23 and the n-side metal pillar 24.

Then, as illustrated in FIG. 18A, the metal film 32 is formed on the surface of the resin layer 45, on the side faces inside the openings 45a and 45b, and on the surfaces of the p-side interconnect layer 21 and the n-side interconnect layer 22 by CVD, PVD or the like. Then, electroplating is performed using the metal film 32 as a seed metal.

Thereby, as illustrated in FIG. 18B, the p-side metal pillar 23 is formed in the opening 45a; and the n-side metal pillar 24 is formed in the opening 45b. The p-side metal pillar 23 and the n-side metal pillar 24 are made of a copper material formed simultaneously by plating. The p-side metal pillar 23 is connected to the p-side interconnect layer 21 via the metal film 32; and the n-side metal pillar 24 is connected to the n-side interconnect layer 22 via the metal film 32. The metal film 32 covers the side face of the p-side metal pillar 23 and the side face of the n-side metal pillar 24.

Figure 19A:
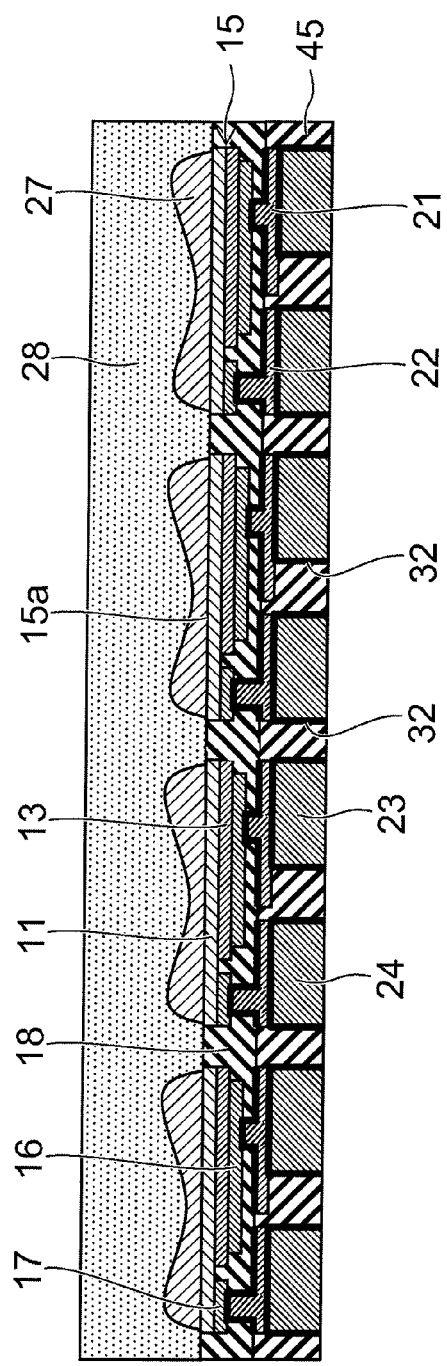
Figure 19B:
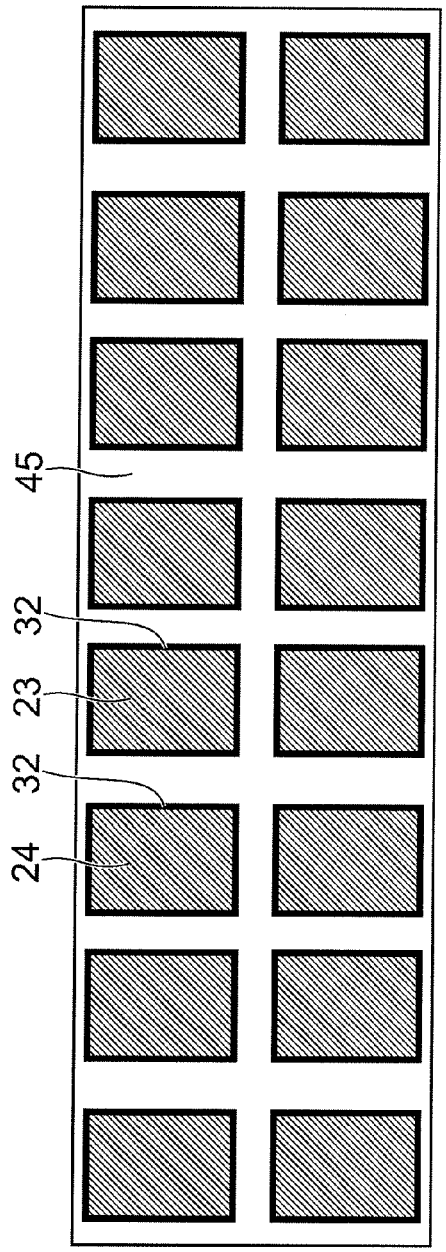

Subsequently, after removing the substrate 10 and forming the lens 27 and the fluorescent layer 28 on the first major surface 15a, the p-side metal pillar 23 and the n-side metal pillar 24 protruding from the openings 45a and 45b are polished. Then, the metal film 32 is removed from the resin layer 45 surface. Thereby, as illustrated in FIG. 19A and FIG. 19B, i.e., the bottom view of FIG. 19A, the electrical connection between the p-side metal pillar 23 and the n-side metal pillar 24 via the metal film 32 is divided.

Fourth Embodiment

Figure 20A:
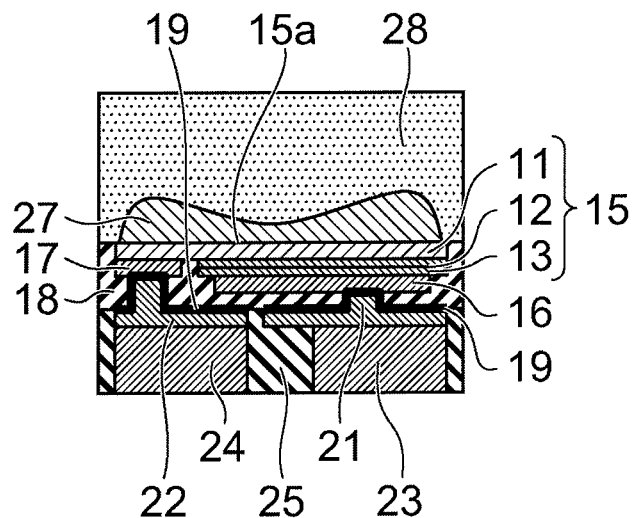
FIGS. 20A and 20B are diagrams of a semiconductor light emitting device of a fourth embodiment.
Figure 20B:
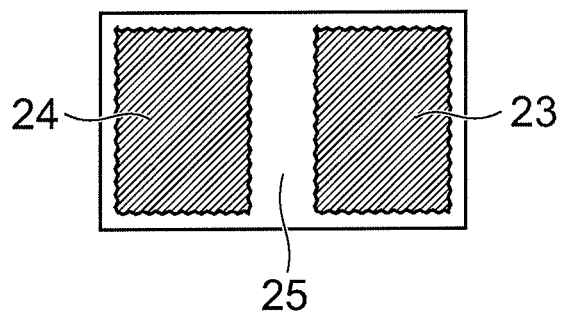

FIG. 20A is a schematic cross-sectional view of a semiconductor light emitting device of a fourth embodiment; and FIG. 20B is a bottom view thereof.

In this embodiment, recesses and protrusions are formed in the side face of the p-side metal pillar 23 and the side face of the n-side metal pillar 24. For example, the recesses and protrusions are repeated as in a folding screen in a direction to enclose each of the side face of the p-side metal pillar 23 and the side face of the n-side metal pillar 24.

The resin layer 25 covers the side face of the p-side metal pillar 23 and the side face of the n-side metal pillar 24. Because the recesses and protrusions are formed in the side face of the p-side metal pillar 23 and the side face of the n-side metal pillar 24, the adhesion strength between the side faces and the resin layer 25 can be increased. As a result, the chipping and the peeling of the resin layer 25 during and/or after the dicing do not occur easily; and the undesirable exposure of the side face of the p-side metal pillar 23 and the side face of the n-side metal pillar 24 can be suppressed.

The processes of the semiconductor light emitting device of this embodiment up to the process of FIG. 5A proceed similarly to those of the first embodiment described above.

Figure 21A:
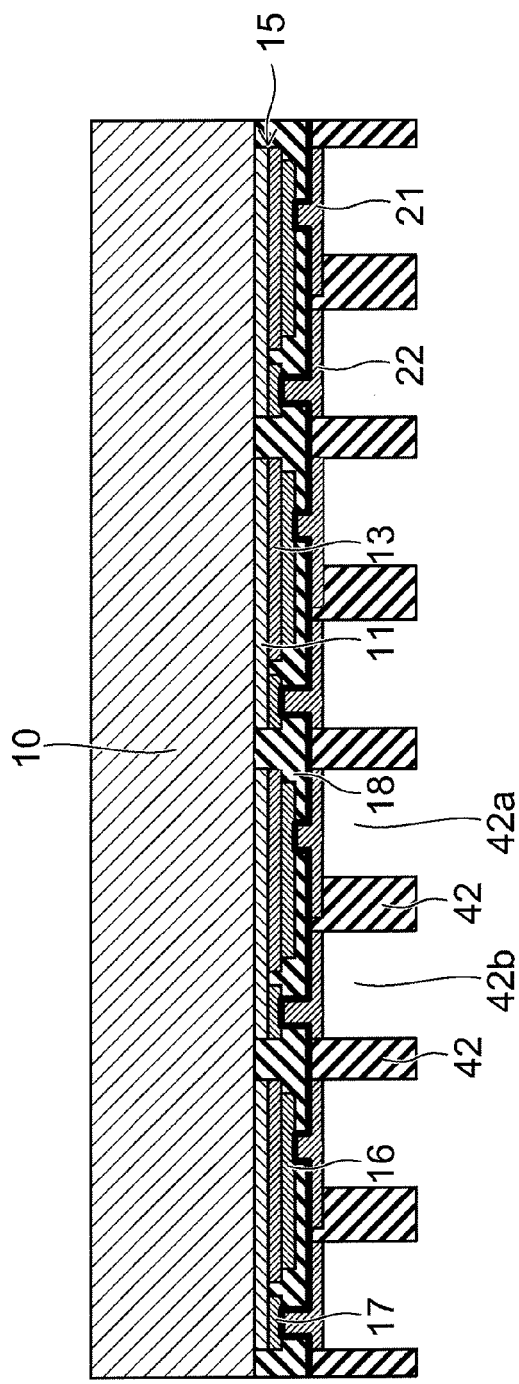
Figure 21B:
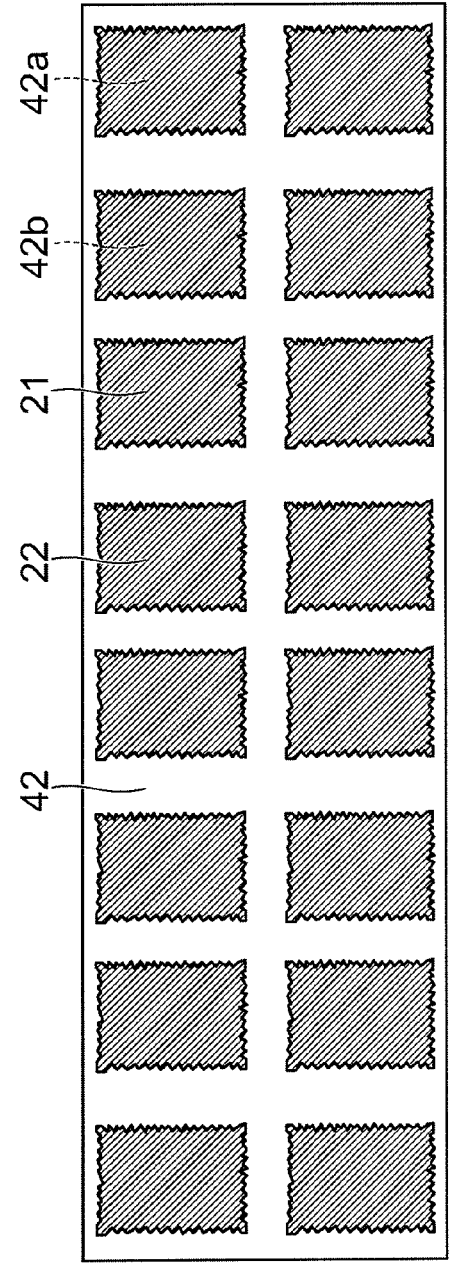

Then, the resist 42 is formed on the face of the insulating layer 18 on the side opposite to the semiconductor layer 15 to cover the p-side interconnect layer 21 and the n-side interconnect layer 22. Subsequently, as illustrated in FIG. 21A and FIG. 21B, i.e., the bottom view of FIG. 21A, multiple openings 42a and 42b are made selectively in the resist 42. The opening 42a reaches the p-side interconnect layer 21; and the opening 42b reaches the n-side interconnect layer 22. Recesses and protrusions are formed in the side faces inside the openings 42a and 42b.

The openings 42a and 42b are made by lithography using a not-illustrated mask. By forming recesses and protrusions in the pattern of the mask corresponding to the openings 42a and 42b, the recesses and protrusions are formed also in the openings 42a and 42b made in the resist 42.

By performing electroplating in this state, the p-side metal pillar 23 is formed inside the opening 42a; and the n-side metal pillar 24 is formed inside the opening 42b as illustrated in FIG. 22A and FIG. 22B, i.e., the bottom view of FIG. 22A.

Because the recesses and protrusions are formed in the side faces inside the openings 42a and 42b, the recesses and protrusions are formed also in the side face of the p-side metal pillar 23 and the side face of the n-side metal pillar 24.

Subsequently, the resist 42 is removed with, for example, a chemical solution (FIG. 23A). Subsequently, wet etching is performed on the exposed portions of the seed metal 19 using the p-side metal pillar 23 and the n-side metal pillar 24 as a mask (FIG. 23B). Thereby, the electrical connection between the p-side interconnect layer 21 and the n-side interconnect layer 22 via the seed metal 19 is divided.

Figure 24A:
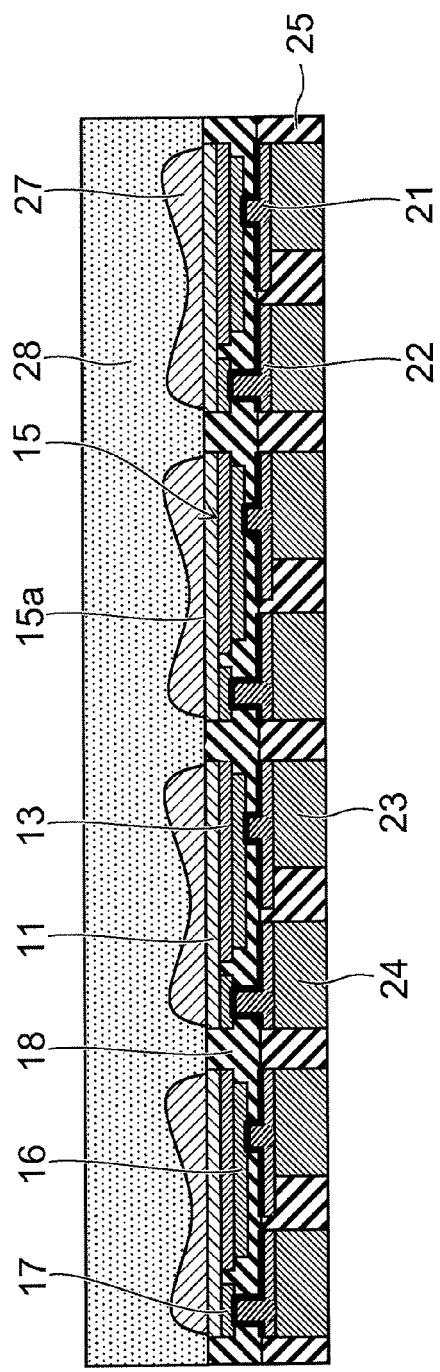
Figure 24B:
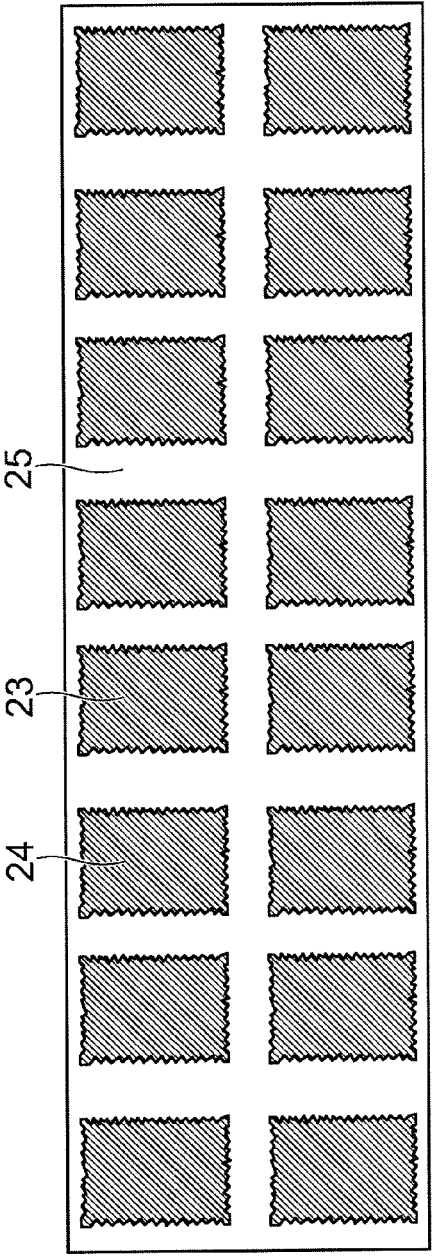

Subsequently, similarly to the first embodiment, the resin layer 25 is filled between the p-side metal pillar 23 and the n-side metal pillar 24. Subsequently, after removing the substrate 10 and forming the lens 27 and the fluorescent layer 28 on the first major surface 15a, the back face of the resin layer 25 is polished. Thereby, as illustrated in FIG. 24A and FIG. 24B, i.e., the bottom view of FIG. 24A, the lower face of the p-side metal pillar 23 and the lower face of the n-side metal pillar 24 are exposed.

This embodiment can use fewer processes than those of embodiments in which the side face of the p-side metal pillar 23 and the side face of the n-side metal pillar 24 are covered with the film.

In the embodiments described above, the substrate 10 may not be removed entirely; and the substrate 10 may be polished to thinly remain on the first major surface 15a. By leaving the substrate 10 in a thin layer, the mechanical strength can be higher than that of the structure in which the substrate 10 is entirely removed; and a structure having high reliability can be provided. The remaining substrate 10 can suppress warp after singulation; and the mounting onto the circuit substrate and the like is easy.

Figure 25A:
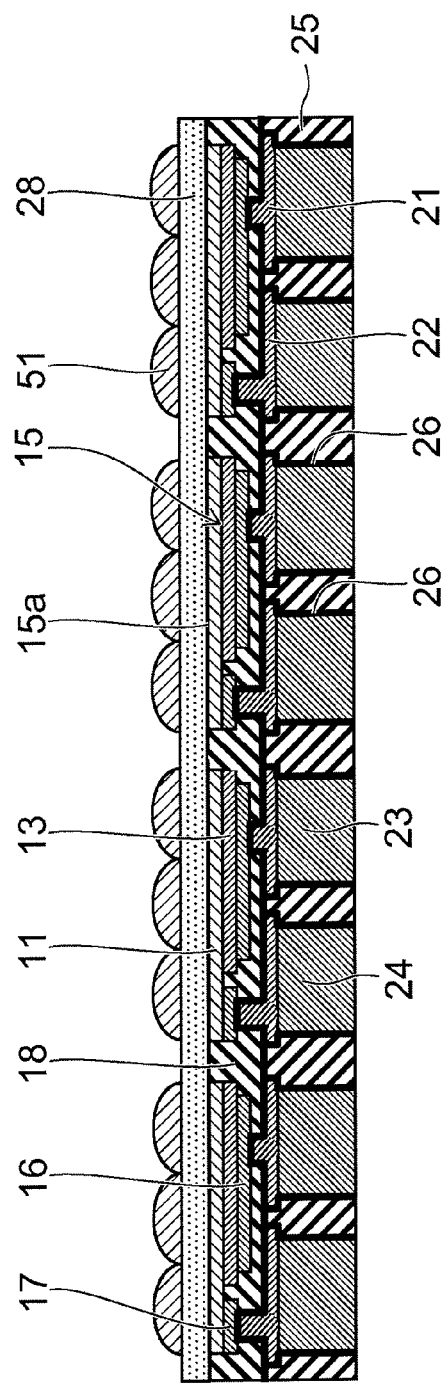
FIGS. 25A and 25B are diagrams illustrating a variation of a lens and a fluorescent layer.

As illustrated in FIG. 25A, after forming the fluorescent layer 28 on the first major surface 15a, a lens 51 may be provided on the fluorescent layer 28. Although the lens 27 having a recessed configuration is illustrated in the embodiments described above, a lens 51 having a protruding configuration as illustrated in FIG. 25A may be used.

Figure 25B:
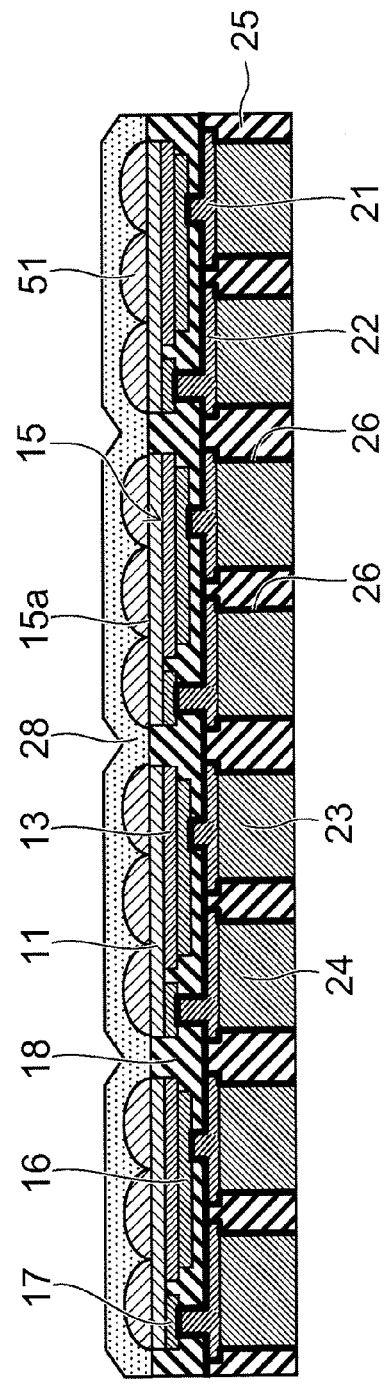

Or, as illustrated in FIG. 25B, after forming the lens 51 on the first major surface 15a, the fluorescent layer 28 may be formed to cover the lens 51.

A red fluorescent layer may contain, for example, a nitride-based phosphor of $CaAlSiN_3$:Eu or a SiAlON-based phosphor.

In the case where a SiAlON-based phosphor is used, it may be used $$(M_{1-x}R_x)_{a1}AlSi_{b1}O_{c1}N_{d1}$$   Compositional Formula (1)

where M is at least one type of metal element excluding Si and Al, and it may be desirable for M to be at least one selected from Ca and Sr; R is a light emission center element, and it may be desirable for R to be Eu; and x, a1, b1, c1, and d1 satisfy the relationships $0<x\leq1$, $0.6<a1<0.95$, $2<b1<3.9$, $0.25<c1<0.45$, and $4<d1<5.7$.

By using the SiAlON-based phosphor of Compositional Formula (1), the temperature characteristics of the wavelength conversion efficiency can be improved; and the efficiency in the high current density region can be improved further.

A yellow fluorescent layer may contain, for example, a silicate-based phosphor of $(Sr, Ca, Ba)_2SiO_4:Eu$.

A green fluorescent layer may contain, for example, a halophosphate-based phosphor of $(Ba, Ca, Mg)_{10}(PO_4)_6 \cdot Cl_2$:Eu or a SiAlON-based phosphor.

In the case where a SiAlON-based phosphor is used, it may be used

$(M_{1-x}R_x)_{a2}AlSi_{b2}O_{c2}N_{d2}$      Compositional Formula (2)

where M is at least one type of metal element excluding Si and Al, and it may be desirable for M to be at least one selected from Ca and Sr; R is a light emission center element, and it may be desirable for R to be Eu; and x, a2, b2, c2, and d2 satisfy the relationships $0<x\leq1$, $0.93<a2<1.3$, $4.0<b2<5.8$, $0.6<c2<1$, and $6<d2<11$.

By using the SiAlON-based phosphor of Compositional Formula (2), the temperature characteristics of the wavelength conversion efficiency can be improved; and the efficiency in the high current density region can be improved further.

A blue fluorescent layer may contain, for example, an oxide-based phosphor of $BaMgAl_{10}O_{17}:Eu$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor light emitting device, comprising:
   a semiconductor layer including a light emitting layer, a first major surface, and a second major surface formed on a side opposite to the first major surface;
   a first electrode provided on the second major surface in a region including the light emitting layer;
   a second electrode provided on the second major surface in a region not including the light emitting layer;
   a first interconnect layer provided on the second major surface side to connect to the first electrode;
   a second interconnect layer provided on the second major surface side to connect to the second electrode;
   a first metal pillar provided on a face of the first interconnect layer on a side opposite to the first electrode, the first metal pillar including a side face having recesses and protrusions, the recesses and protrusions not arrayed from a top to a bottom of a height direction of the first metal pillar;
   a second metal pillar provided on a face of the second interconnect layer on a side opposite to the second electrode, the second metal pillar including a side face having recesses and protrusions, the recesses and protrusions not arrayed from a top to a bottom of a height direction of the second metal pillar; and
   a resin layer covering the side face of the first metal pillar and the side face of the second metal pillar.

2. The device of claim 1, wherein each of a thickness of the first metal pillar and a thickness of the second metal pillar is thicker than a thickness of a stacked body including the semiconductor layer, the first electrode, the second electrode, the first interconnect layer, and the second interconnect layer.

3. The device of claim 1, wherein a surface area of the first electrode is greater than a surface area of the second electrode.

4. The device of claim 1, wherein a contact surface area between the second interconnect layer and the second metal pillar is greater than a contact surface area between the second interconnect layer and the second electrode.

5. The device of claim 1, wherein a portion of the second interconnect layer extends to a position to facing the light emitting layer.

6. The devices of claim 1, wherein the recesses and protrusions of the first metal pillar and the second metal pillar have a folding screen shape.

7. The device of claim 1, further comprising an insulating layer provided on the second major surface side of the semiconductor layer, wherein
   the first interconnect layer penetrates the insulating layer and reaches the first electrode, and the second interconnect layer penetrates the insulating layer and reaches the second electrode.

8. The device of claim 1, wherein the second interconnect layer has a first face connected to the second electrode, and a second face on a side opposite to the first face, the second face being larger than the first face.

9. The device of claim 1, wherein
   The semiconductor layer does not include a substrate on the first major surface side, and
   a fluorescent layer is provided on the first major surface side without a substrate between the first major surface and the fluorescent layer.

10. The device 1, wherein the recesses and protrusions are continuously formed around the side face of the first metal pillar and the side face of the second metal pillar.

* * * * *